United States Patent [19]
Park et al.

[11] Patent Number: 6,107,143
[45] Date of Patent: Aug. 22, 2000

[54] METHOD FOR FORMING A TRENCH ISOLATION STRUCTURE IN AN INTEGRATED CIRCUIT

[75] Inventors: Tai-Su Park, Kwacheon; Han-Sin Lee, Euywang; Yu-Gyun Shin, Seoul, all of Rep. of Korea

[73] Assignee: Samsung Electronics Co., Ltd., Suwon, Rep. of Korea

[21] Appl. No.: 09/150,668

[22] Filed: Sep. 10, 1998

[30] Foreign Application Priority Data

Mar. 2, 1998 [KR] Rep. of Korea .................. 98-6840

[51] Int. Cl.[7] ................................. H01L 21/762
[52] U.S. Cl. .................... 438/296; 438/437; 438/692; 438/696; 438/702
[58] Field of Search .................... 438/424, 427, 438/435, 437, FOR 227, 296, 692, 696, 702; 148/DIG. 50

[56] References Cited

U.S. PATENT DOCUMENTS

| | | |
|---|---|---|
| 5,004,703 | 4/1991 | Zdebel et al. . |
| 5,447,884 | 9/1995 | Fahey et al. . |
| 5,492,858 | 2/1996 | Bose et al. . |
| 5,786,263 | 7/1998 | Perera . |
| 5,885,883 | 3/1999 | Park et al. . |

OTHER PUBLICATIONS

T. Park et al., "Coprrelation of the Gate Oxide Reliability with the Densification Condition of the Trench Filling CVD Oxide in Deep Sub–micron Si Devices", Source Unknown, date unknown.

K. Ishimaru et al., "Michanical Stress Induced MOSFET Punch–through and Process Optimization for Deep Submicron TEOS–O3 filled STI Device" 1997 Symposium on VLSI Technology Digest of Technical Papers, pp. 123–124.

Tai–su Park et al., "Correlation between Gate Oxide Reliability and the Profile of the Trench Top Corner in Shallow Trench Isolation (STI)" 1996 IEEE, pp. 747–750.

*Primary Examiner*—George Fourson
*Attorney, Agent, or Firm*—Jones Volentine, L.L.P.

[57] ABSTRACT

A method is provided for forming a trench isolation structure in an integrated circuit that has a better reliability and an acceptable time-dependent dielectric breakdown over a greater range of production. The manufacturing method involves etching a trench in a semiconductor substrate, forming a sidewall-insulating layer along the sidewall and bottom of the trench, and depositing a trench-insulating layer in the trench and over the semiconductor substrate. The sidewall-insulating layer is formed to have a lower etch rate than the trench-insulating layer. As a result of this difference in etch rates, the sidewall-insulating layer is not damaged too much during wet etching processes that take place during the later part of manufacture. This makes the interface between the substrate, sidewall-insulating layer, and gate oxide more reliable. The difference in etching rate can be obtained by keeping an annealing process used in later processing below a threshold temperature so that the etch rate of the trench-isolating layer does fall too low. The difference in etching rate can also be obtained by using different materials for the sidewall-isolating layer and the trench-isolating layer, or by using multiple annealing processes.

14 Claims, 21 Drawing Sheets

(6 of 21 Drawing Sheet(s) Filed in Color)

METHOD FOR FORMING A TRENCH ISOLATION STRUCTURE IN AN INTEGRATED CIRCUIT

BACKGROUND OF THE INVENTION

1. Field of the Invention

The present invention generally relates to trench isolation structures in integrated circuits. More particularly, the present invention relates to a method for forming shallow trench isolation (STI) structures in integrated circuits having high integration density.

2. Description of the Related Art

Conventional semiconductor design uses a trench-isolation type method of isolating elements on an integrated circuit. In a trench-isolation method, a trench with rounded corners is formed on the surface of a semiconductor substrate to embed an insulator in the substrate. This method helps to make semiconductor devices smaller and to enhance the reliability of such devices, especially the gate reliability of such devices. An example of this method is disclosed in U.S. Pat. No. 4,923,821, and "Correlation between Gate Oxide Reliability and the Profile of the Trench Top Corner in Shallow Trench Isolation (STI)" by Tai-su Park, et al., published in a Proceeding of the IEEE, IEDM 1996, p 747–750.

FIG. 1 is a flow chart showing the steps in a conventional trench-isolation type fabrication method. FIGS. 2A through 2L are cross-sectional views showing the semiconductor substrate during the process shown in FIG. 1.

As shown in FIGS. 1 and 2A, the process begins by growing a pad oxide layer 3 on a semiconductor substrate 1 (Step 10). The process then continues by depositing and patterning a silicon nitride layer 5 over the pad oxide layer 3 (Step 15).

As shown in FIG. 2B, a trench 7 is then etched out of the semiconductor substrate 1 using the patterned silicon nitride layer 5 as a mask (Step 20). As shown in FIGS. 2C and 2D, a sidewall-insulating layer 9 is then formed on the bottom and inside walls of the trench 7 and a trench-insulating layer 11 is formed in the trench 7 (Step 25).

The process of forming the sidewall-insulating layer 9 on the bottom and inside walls of the trench 7 and the trench-insulating layer 11 in the trench 7 includes a number of sub-steps. First, the sidewall-insulating layer 9, shown in FIG. 2C, is grown on the bottom and inside walls of the trench 7 (Step 100). The sidewall-insulating layer 9 is preferably grown in an $O_2$ ambient atmosphere by oxidizing the exposed silicon surface. The sidewall-insulating layer 9 functions to reduce the trench etching damage and passivate the exposed silicon surface.

As shown in FIG. 2D, a trench-insulating layer 11 is then deposited into the trench 7, and over the silicon nitride layer 5 (Step 110). As noted above, the trench-insulating layer is often a CVD oxide such as $SiO_2$.

The trench-insulating layer 11 is then reduced by a chemical-mechanical polishing (CMP) process using the silicon nitride layer 5 as a stopper (Step 120), as shown in FIG. 2E. This leaves the trench 7 filled with the trench-insulating layer 11, and the top of the trench-insulating layer 11 even with the top of the silicon nitride layer 5.

Finally, the trench-insulating layer 11 is annealed (densified) in an $N_2$ or Ar gas ambient. In this annealing process, a high temperature is required to lower junction current by annealing the stress. A high temperature for the annealing also avoids the problems of leaky junctions, defect generation via the junctions, and too high wet etch rate of the CVD (Step 130). Preferably, the temperature is kept above 1150° C. This densifies the trench-insulating layer 11 and thus increases its resistance to wet etching.

After the a sidewall-insulating layer 9 and the trench-insulating layer 11 are formed, the active silicon nitride layer 5 is then removed using a wet etching process, as shown in FIG. 2F (Step 30). Since the trench-insulating layer 11 has previously been annealed in step 130, its etching rate is reduced and the wet etching process results in only minimal etching of the trench-insulating layer 11. Then, as shown in FIG. 2G, the pad oxide layer 3 is also removed by wet etching (Step 35).

A sacrificial oxide layer 13 is then grown over the semiconductor substrate using a thermal oxidation method in an $O_2$ or $H_2O$ ambient (Step 40), as shown in FIG. 2H. Ion implantation 15 is then performed to create heavily-doped regions 17 (Step 45), and the sacrificial oxide layer 13 is then removed (Step 50), as shown in FIG. 2I. The sacrificial oxide 13 is usually removed by another wet etching process, which also etches away an additional part of the trench-insulating layer 11.

As shown in FIG. 2J, a gate oxide layer is then grown over the substrate I (Step 55). During this step, the oxide layer naturally goes flat within an optimum process condition.

Finally, as shown in FIG. 2K, the gate electrode 21 is deposited over the gate oxide layer 19 and the trench-isolating layer 11 (Step 60).

FIG. 2L shows the same structure as FIG. 2K, except that the sidewall-insulating layer 9, the trench-isolation layer 11, and the gate oxide layer 19 are all conceptually identified as a single unified oxide layer 23. Since all of these three layers are oxide layers, and all serve a similar function, it is helpful at times to consider then functionally as a single layer rather than three separate layers.

In STI structures formed by the conventional method, chemical-vapor deposition (CVD) oxides are most commonly used as a trench embedding material. After such a CVD oxide is filled into the trench formed in the semiconductor substrate, a high temperature annealing process is carried out to densify the embedded CVD oxide and to reduce its wet etch rate. This is done because, unannealed, the CVD oxide has a very low resistance against wet etching and will be damaged in later processing.

While it has its advantages, however, the conventional trench-isolation method does have significant disadvantages as well. As shown in FIGS. 3A to 3C, the polishing step 120 can result in widely varying heights for the silicon nitride layer 5 and the trench-insulating layer 11. FIG. 3A shows a situation where the silicon nitride layer 5 and the trench-insulating layer 11 are polished to a height greater than a desired height; FIG. 3B shows a situation where the silicon nitride layer 5 and the trench-insulating layer 11 are polished at the desired height; and FIG. 3C shows a situation where the silicon nitride layer 5 and the trench-insulating layer 11 are polished to a height lower than a desired height.

This in turn causes problems with the wet etching used in step 30. If the silicon nitride layer 5 and the trench-insulating layer 11 are too high before the wet etching, the trench-insulating layer 11 will remain too high after the wet etching. Similarly, if the silicon nitride layer 5 and the trench-insulating layer 11 are too low before the wet etching, the trench-insulating layer 11 will remain too low after the wet etching. This is illustrated in FIGS. 4A, 4B, and 4C. FIG. 4A shows the results of the wet etching in step 30 if the silicon nitride layer 5 and the trench-insulating layer 11 are too high after the CMP process of step 120; FIG. 4B shows the results of the wet etching in step 30 if the silicon nitride layer 5 and the trench-insulating layer 11 are of the desired height after step 120; and FIG. 4C shows the results of the wet etching in step 30 if the silicon nitride layer 5 and the trench-insulating layer 11 are too low after step 120.

The ultimate result of the variation in heights after the CMP process of step 120 is that the trench isolation structure will have an irregularity in its level, as shown in FIGS. 5A, 5B, and 5C, after the gate electrode 21 has been deposited in step 60. It is, of course, desirable that the gate electrode be level as shown in FIG. 5B, but this only happens if the CMP process of step 120 is done at exactly the right level. If the CMP process leaves the silicon nitride layer 5 and the trench-insulating layer 11 too high, there will be a bump in the trench region that the gate electrode 21 must flow over, as is shown in FIG. 5A. Likewise, if the CMP process leaves the silicon nitride layer 5 and the trench-insulating layer 11 too low, there will be a depression in the trench region that the gate electrode 21 must fill, as is shown in FIG. 5C.

The true problem in these two alternatives is that they place undue stress on the junction where the sidewall-insulating layer 9 and the gate oxide layer 19 meet. This can degrade the performance of the resulting structure by providing imperfect insulation between the gate electrode 21 and the heavily-doped regions 17.

A measure of the stress on this junction can be taken through a time dependent dielectric breakdown (TDDB) test. The TDDB measured by this test gives an indication of the reliability time (in seconds) before gate oxide failure when the proper bias voltage is applied to the gate electrode. In other words, it shows how long you could continually apply the bias voltage to the gate electrode before the device suffers a fatal breakdown. It is generally desirable to keep the TDDB measurement above 100 seconds with an electric field of 15 MV/cm.

As an example, if an entire top surface of the trench isolation region 11 is evenly planarized with the gate oxide region 19, as shown in FIG. 5B, devices have been measured to have TDDB measurements of more than 1200 seconds If, on the other hand, the height of the trench isolation region 11 is depressed compared to the height of the gate oxide region 19, as shown in FIG. 5C, or if the height of the trench isolation region is raised compared to the height of the gate oxide region 19, as shown in FIG. 5A, devices have been measured to have TDDB measurements as low ten seconds. This reliability is too poor for most applications, and seriously reduces the production rates of the manufacturing process.

The reason for this failure can be seen in FIGS. 6A through 6C and FIGS. 7A through 7C. FIGS. 6A through 6C are cross-sectional views showing the interface between the sidewall-insulating layer 9 and the gate oxide 19 for various results of the chemical-mechanical polishing step. FIGS. 7A through 7C are graphs showing the stress distribution of the semiconductor device at the interface between the sidewall-insulating layer 9 and the gate oxide 19 for various results of the chemical-mechanical polishing step.

FIG. 6A shows a semiconductor cross-section and FIG. 7A shows a stress distribution of the semiconductor device where the silicon nitride layer 5 and the trench-insulating layer 11 are polished to a height greater than a desired height. FIG. 6B shows a semiconductor cross-section and FIG. 7B shows a stress distribution of the semiconductor device where the silicon nitride layer 5 and the trench-insulating layer 11 are polish ed at the desired height. FIG. 6C shows a semiconductor cross-section and FIG. 7C shows a stress distribution of the semiconductor device where the silicon nitride layer 5 and the trench-insulating layer 11 are polished to a height lower than a desired height.

As can be seen in FIGS. 6B and 7B, when the trench-insulating layer 11 is formed to be of the desired height, the interface between the sidewall-insulating layer 9 and the gate oxide layer 19 is smooth and the stress generated is relatively low. This lower stress leads to a higher TDDB factor and allows the resulting device to operate within acceptable parameters.

However, as shown in FIGS. 6A and 7A, if the trench-insulating layer 11 is formed too high, the interface between the sidewall-insulating layer 9 and the gate oxide layer 19 is less stable and the stress generated increases. If the trench-insulating layer is too low, the stress will lower the TDDB factor below an acceptable range.

Similarly, as shown in FIGS. 6C and 7C, if the trench-insulating layer 11 is formed too low, the interface between the sidewall-insulating layer 9 and the gate oxide layer 19 is also less stable and the stress generated increases. If the trench-insulating layer is too high, the stress will lower the TDDB factor below an acceptable range.

A greater production reliability is required to improve the yield in the manufacture of trench-isolation semiconductor devices. If the height of the trench-insulating layer 11 cannot be better regulated, it is necessary to improve the performance of the interface between the sidewall-insulating layer 9 and the gate oxide layer 19.

SUMMARY OF THE INVENTION

It is therefore an object of this invention to find a way to increase the reliability of semiconductor devices across a greater variety of heights of the trench isolation region.

It is another object of this invention to ensure that the etch rate of the sidewall-insulating region remains lower than the etch rate of the trench-insulating region during any wet etching processes that the device must undergo during processing.

According to one aspect of the present invention, a method is provided for forming a trench isolation structure in an integrated circuit, the method comprising the steps of: etching a trench in a semiconductor substrate, growing a sidewall-insulating layer along the sidewall and bottom of the trench, depositing a trench-insulating layer in the trench and over the semiconductor substrate, performing a chemical-mechanical polishing process to reduce the height of the trench-insulating layer, performing an annealing process to lower the etch rate of the trench-insulating layer from an original trench etch rate to an annealed trench etch rate, performing ion implantation in the semiconductor substrate adjacent to the trench to form at least one doped region, growing a gate oxide layer over the at least one doped region, and depositing a gate electrode over the trench and the gate oxide, wherein the annealing process is carried out at a temperature low enough that the annealed trench etch rate remains higher than a sidewall etch rate of the sidewall-insulating layer.

The method may include the steps of: depositing and patterning an active silicon nitride layer over the substrate prior to the step of etching the trench, and removing the active silicon nitride layer after the step of performing a chemical-mechanical polishing process. The active silicon nitride layer may be used as a stopper for the step of performing a chemical-mechanical polishing process.

The method may also include the steps of: growing a pad oxide layer over the semiconductor substrate prior to the step of etching the trench, and removing the pad oxide layer prior to the step of performing ion implantation.

In this method the annealing process is preferably carried out at a temperature between 800 and 1150° C., most preferably at approximately 1050° C.

According to another aspect of the present invention, a method is provided for forming a trench isolation structure in an integrated circuit, the method comprising the steps of: etching a trench in a semiconductor substrate, depositing a sidewall-insulating layer comprising an insulating material along the sidewall and bottom of the trench, performing a first annealing process to lower the etch rate of the sidewall-insulating layer from an original sidewall etch rate to a first annealed sidewall etch rate, depositing a trench-insulating layer comprising the insulating material in the trench and over the semiconductor substrate, performing a chemical-mechanical polishing process to reduce the height of the trench-insulating layer, performing a second annealing process to lower the etch rate of the sidewall-insulating layer from the first annealed sidewall etch rate to a second annealed sidewall etch rate, and to lower the etch rate of the trench-insulating layer from an original trench etch rate to an annealed trench etch rate, performing ion implantation in the semiconductor substrate adjacent to the trench to form at least one doped region, growing a gate oxide layer over the at least one doped region, and depositing a gate electrode over the trench and the gate oxide, wherein the second annealed sidewall etch rate is lower than the annealed trench etch rate.

According to still another aspect of the present invention, a method is provided for forming a trench isolation structure in an integrated circuit, the method comprising the steps of: etching a trench in a semiconductor substrate, forming a sidewall-insulating layer comprising a first insulating material along the sidewall and bottom of the trench, depositing a trench-insulating layer comprising a second insulating material in the trench and over the semiconductor substrate, performing a chemical-mechanical polishing process to reduce the height of the trench-insulating layer, performing a final annealing process to lower the etch rate of the trench-insulating layer from an original trench etch rate to an annealed trench etch rate, performing ion implantation in the semiconductor substrate adjacent to the trench to form at least one doped region, growing a gate oxide layer over the at least one doped region, and depositing a gate electrode over the trench and the gate oxide layer, wherein a final sidewall etch rate of the first insulating material is lower than the annealed trench etch rate of the second insulating material.

This method may also include the step of performing a first annealing process after the step of forming the sidewall-insulating layer to lower the etch rate of the sidewall-insulating layer from an original sidewall etch rate to an annealed sidewall etch rate, wherein the step of forming a sidewall-insulating layer is performed by depositing the first insulating material along the sidewall and bottom of the trench, and wherein the final annealing process lowers the etch rate of the sidewall-insulating layer from the annealed sidewall etch rate to the final sidewall etch rate.

The sidewall-insulating layer in this method may comprise SiON, and the step of forming a sidewall-insulating layer may be performed by depositing SiON along the sidewall and bottom of the trench.

The step of forming a sidewall-insulating layer may further comprise the sub-steps of: depositing an SiN layer along the sidewall and bottom of the trench, and oxidizing the SiN layer in an $O_2$ ambient atmosphere to form the sidewall insulating layer. Alternatively, the step of forming a sidewall-insulating layer may further comprise the sub-steps of: growing an $SiO_2$ layer along the sidewall and bottom of the trench, and baking the $SiO_2$ layer in a nitrogen-rich ambient atmosphere to form the sidewall-insulating layer. The nitrogen-rich ambient atmosphere in this step may be $N_2$ or $NH_3$.

BRIEF DESCRIPTION OF THE DRAWINGS

The file of this patent contains at least one drawing executed in color. Copies of this patent with color drawings will be provided by the Patent and Trademark Office upon request and payment of the necessary fee.

The above and other objects and advantages of the present invention will become readily apparent from the description that follows, with reference to the accompanying drawings, in which.

DESCRIPTION OF THE PREFERRED EMBODIMENTS

Figure 1:
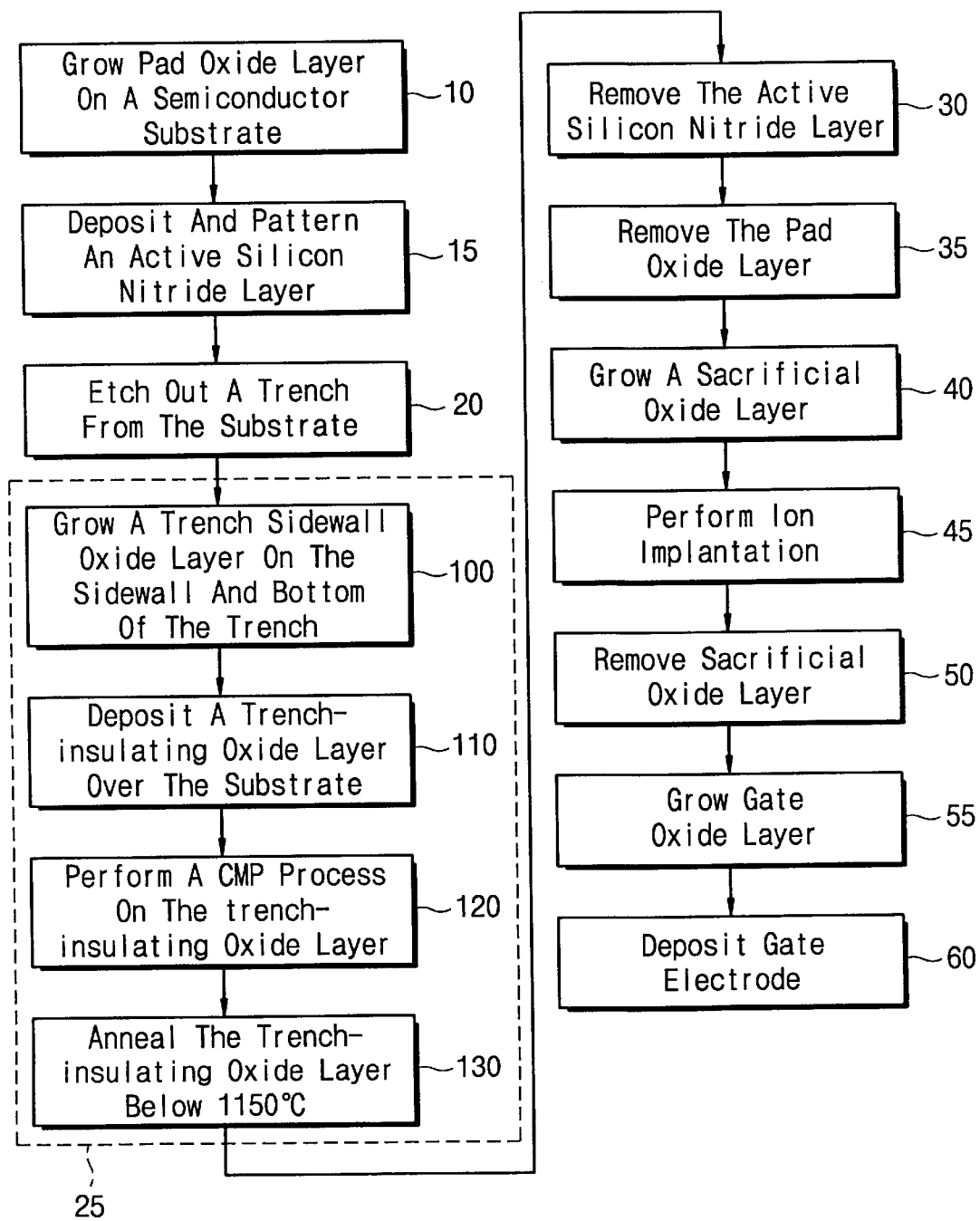
FIG. 1 is a flow chart showing the steps in a conventional trench-isolation type fabrication method.
Figure 2A:
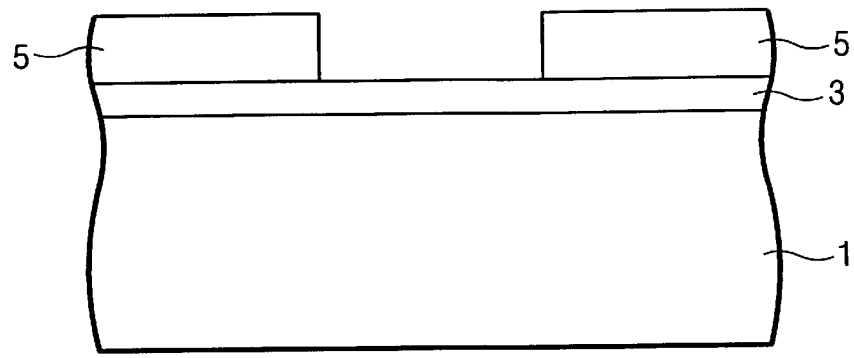
FIGS. 2A through 2L are cross-sectional views showing the semiconductor substrate during the process shown in FIG. 1.
Figure 2B:
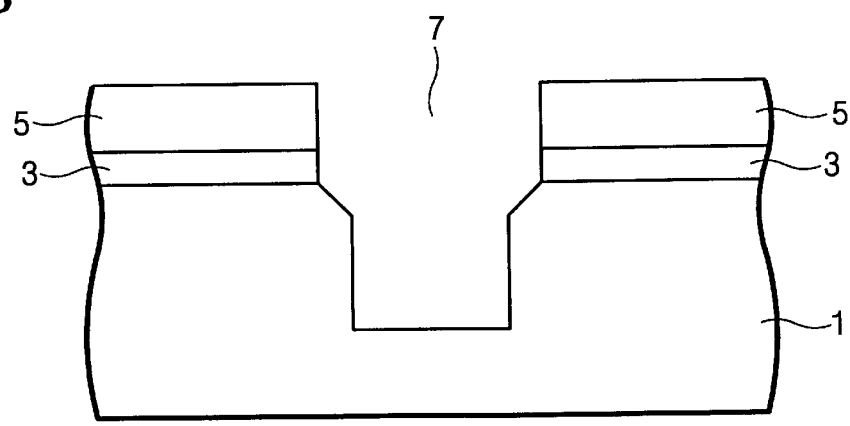
Figure 2C:
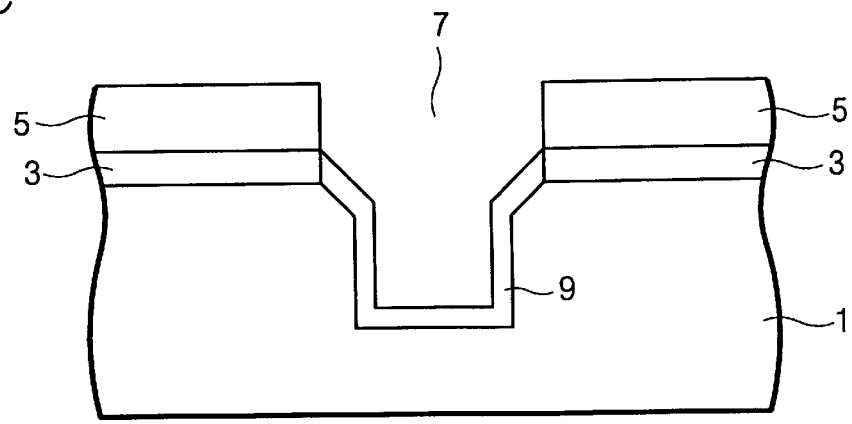
Figure 2D:
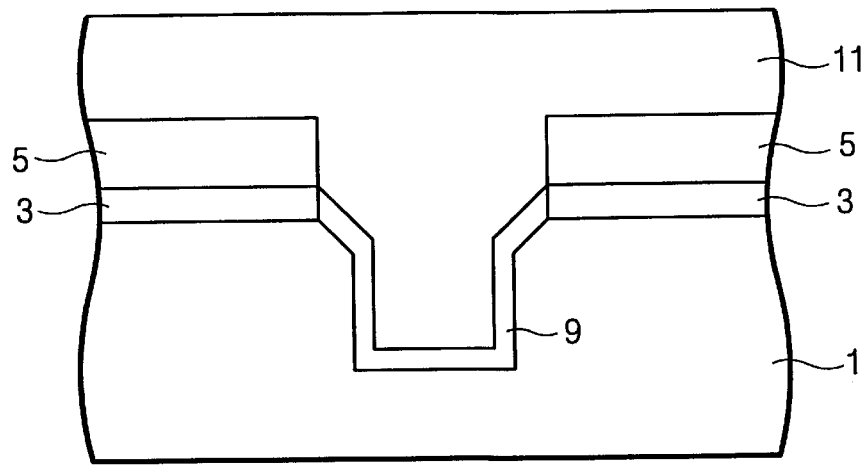
Figure 2E:
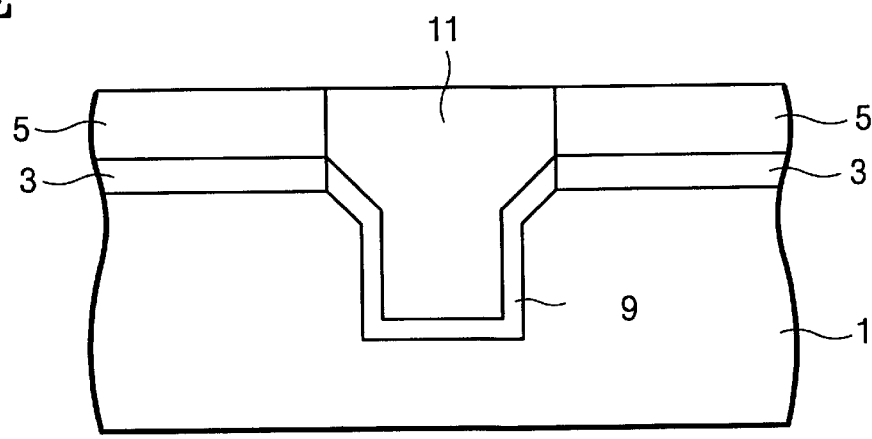
Figure 2F:
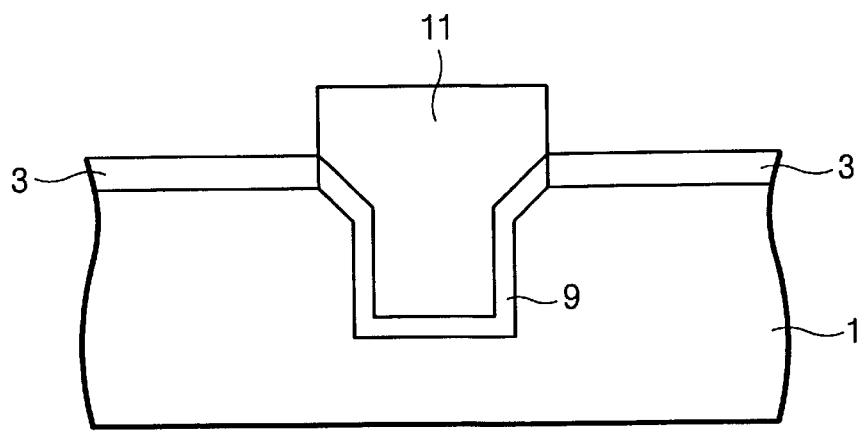
Figure 2G:
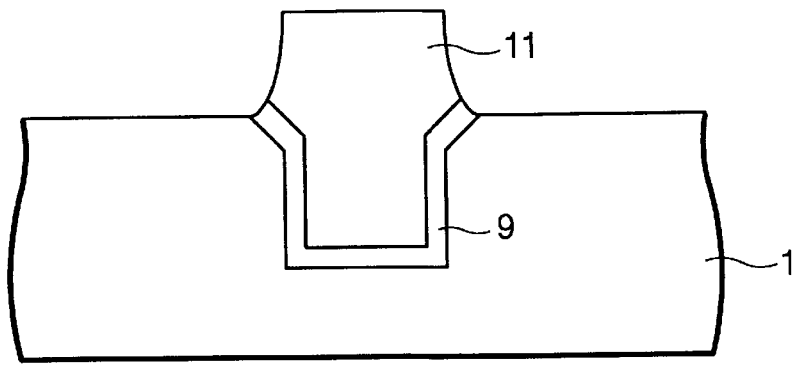
Figure 2H:
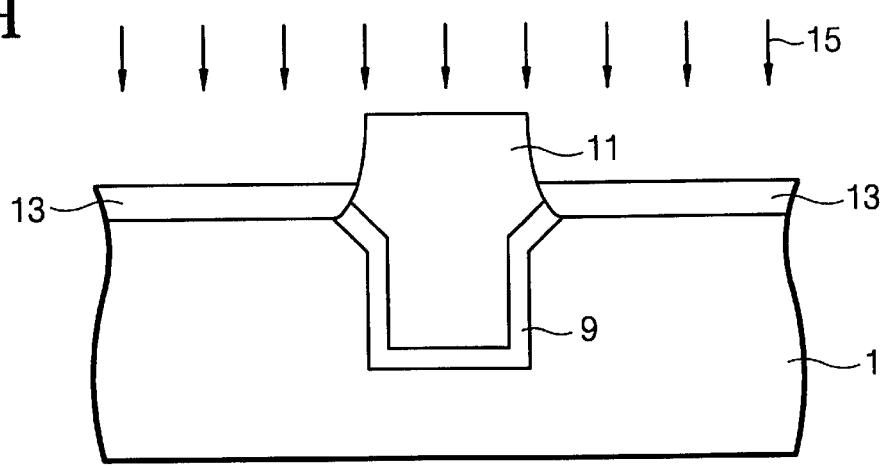
Figure 2I:
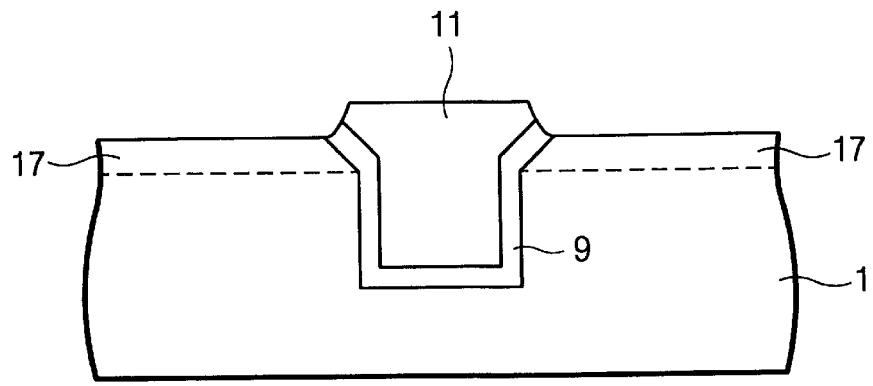
Figure 2J:
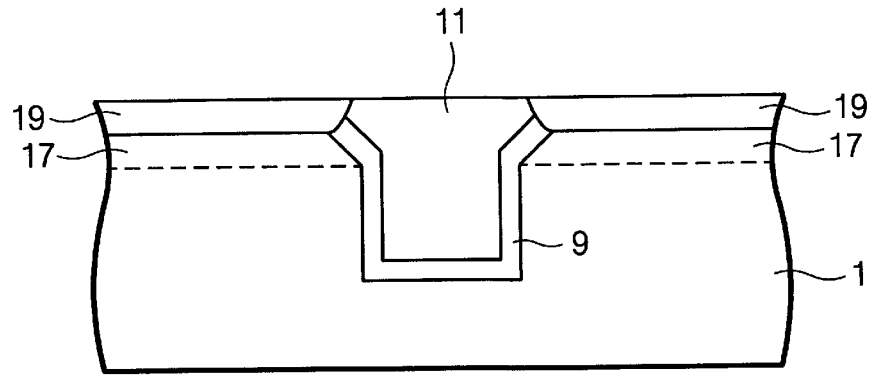
Figure 2K:
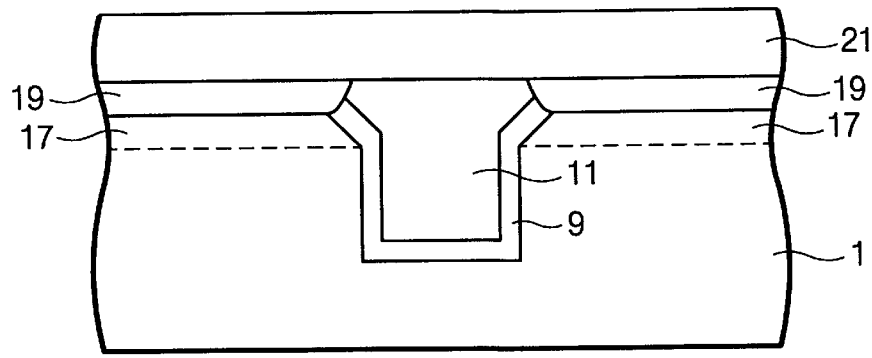
Figure 2L:
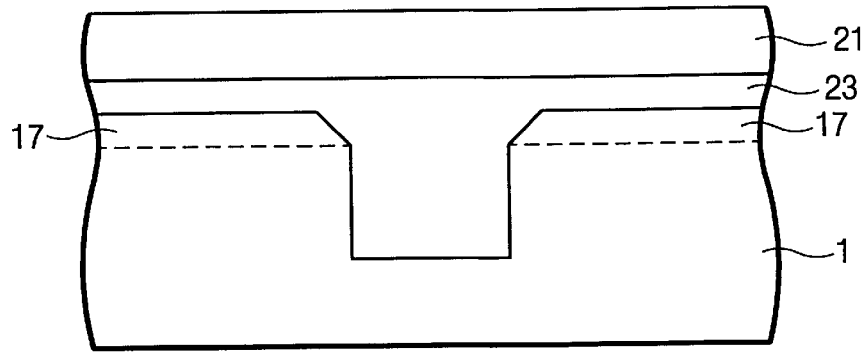
Figure 3A:
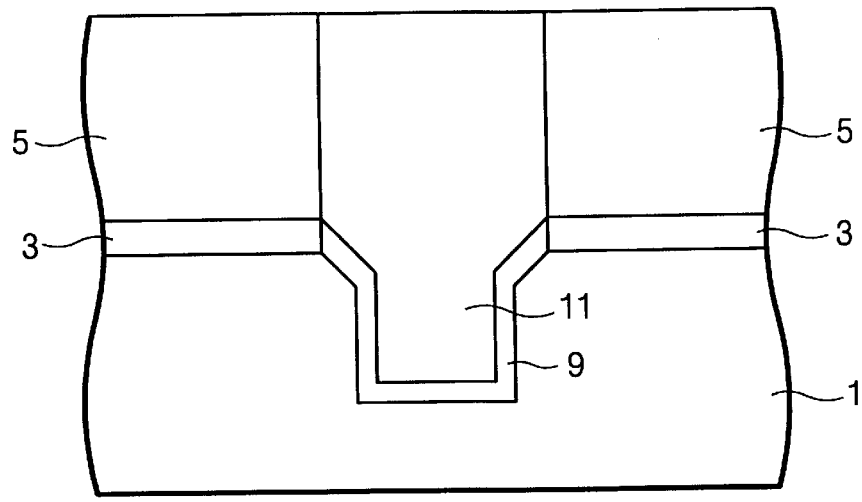
FIGS. 3A through 3C are cross-sectional views showing the semiconductor substrate as shown in FIG. 2E for various results of the chemical-mechanical polishing step.
Figure 3B:
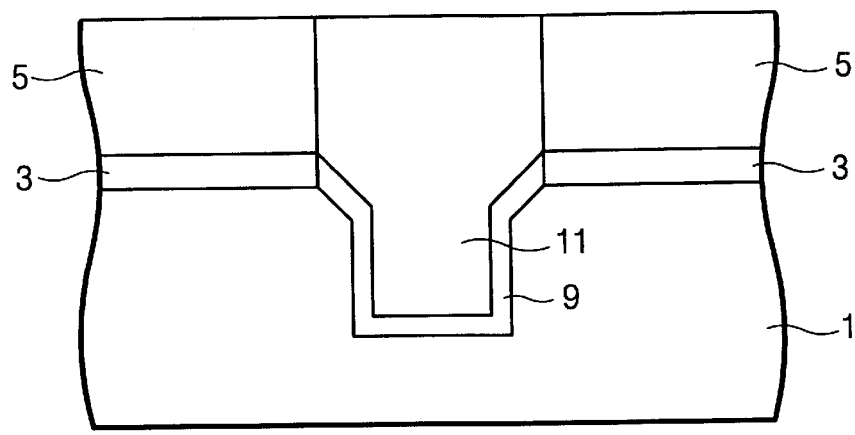
Figure 3C:
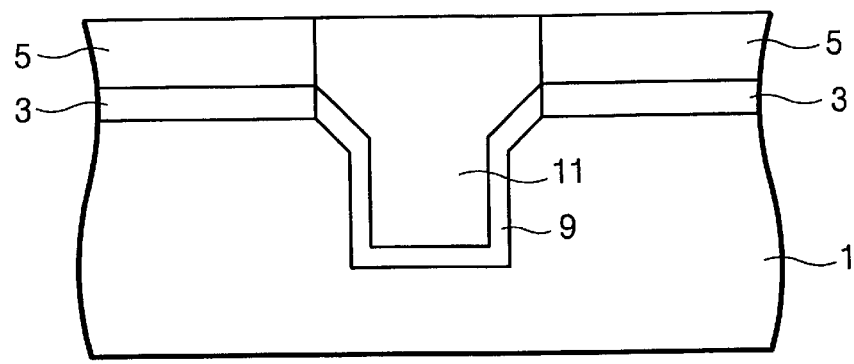
Figure 4A:
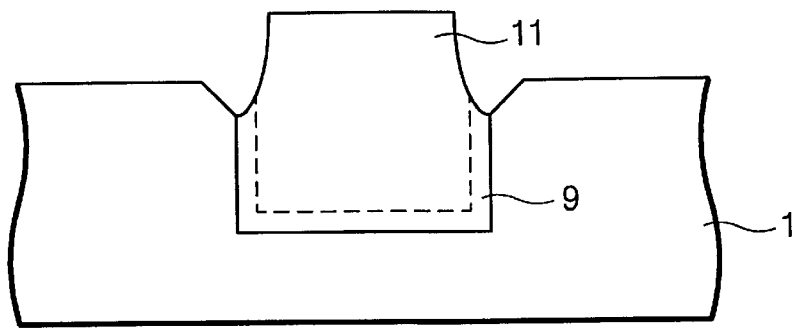
FIGS. 4A through 4C are cross-sectional views showing the semiconductor substrate as shown in FIG. 2G for various results of the chemical-mechanical polishing step.
Figure 4B:
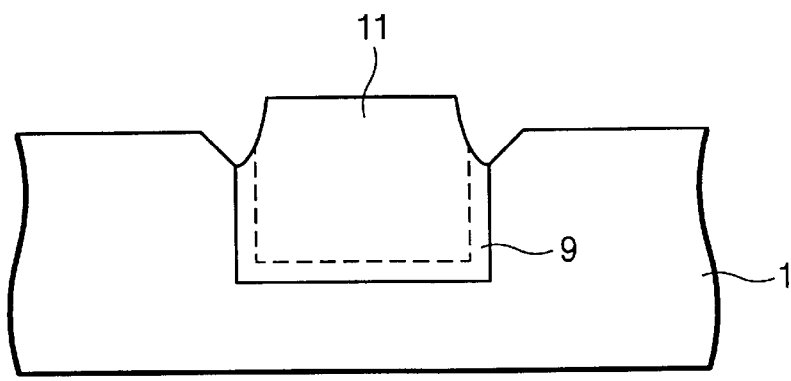
Figure 4C:
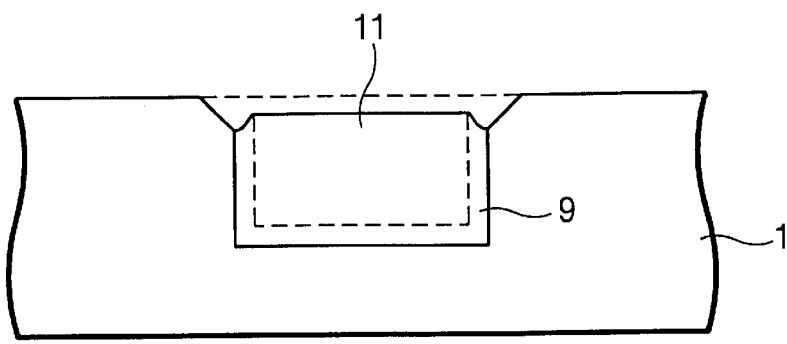
Figure 5A:
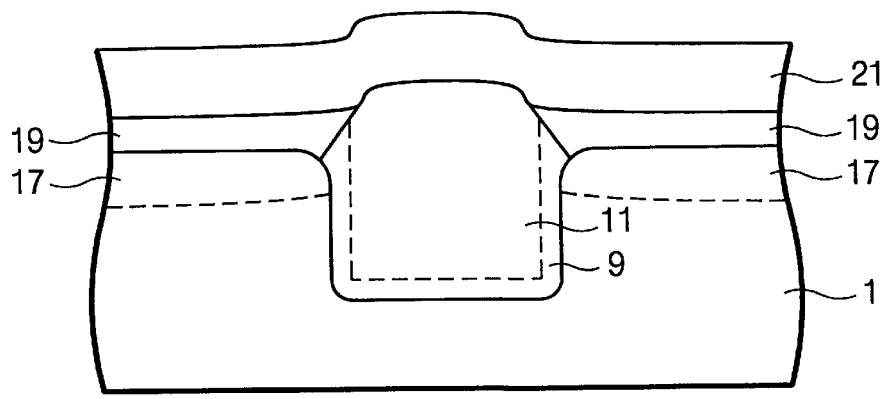
FIGS. 5A through 5C arc cross-sectional views showing the semiconductor substrate as shown in FIG. 2L for various results of the chemical-mechanical polishing step.
Figure 5B:
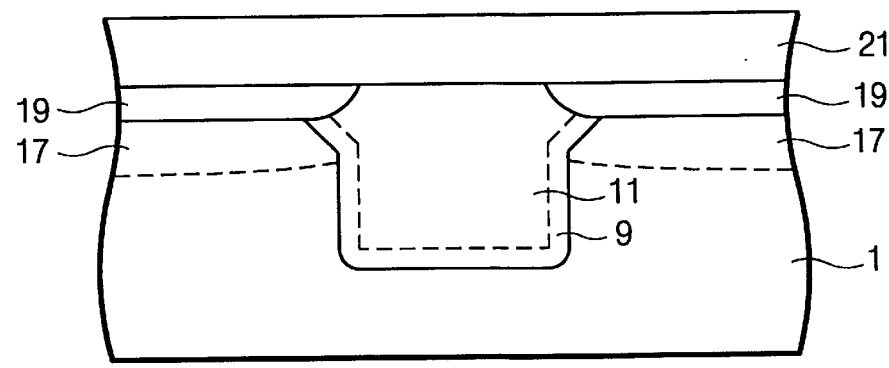
Figure 5C:
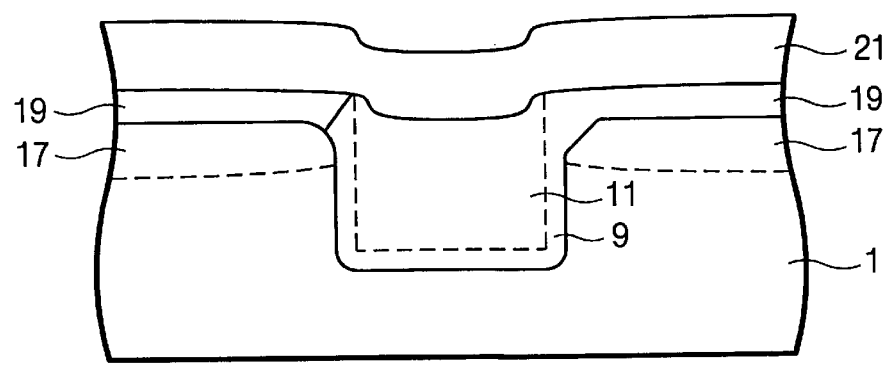
Figure 6A:
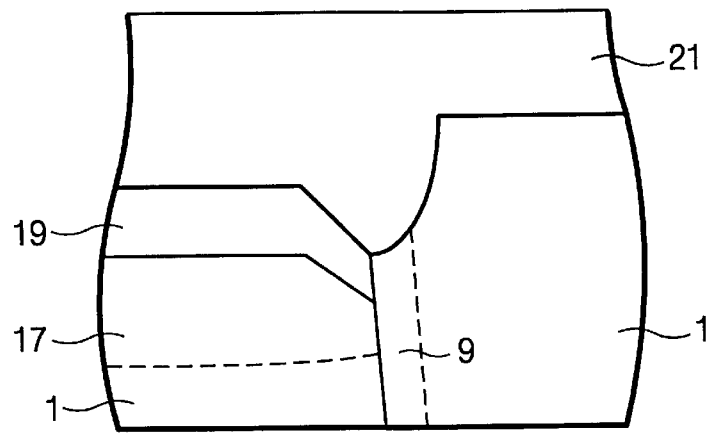
FIGS. 6A through 6C are cross-sectional views showing the interface between the sidewall-insulating layer and the gate oxide for various results of the chemical-mechanical polishing step.
Figure 6B:
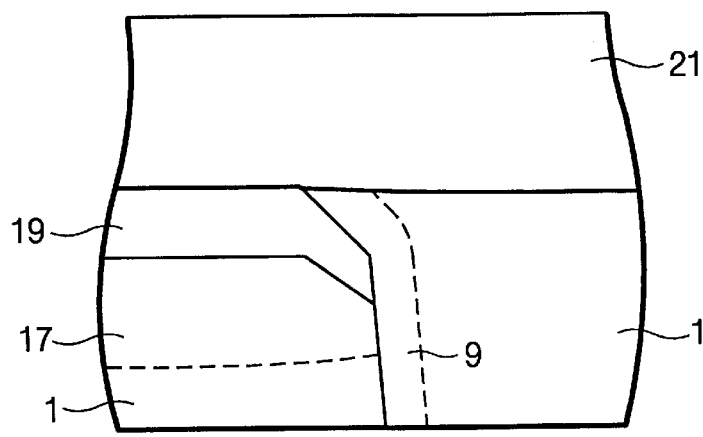
Figure 6C:
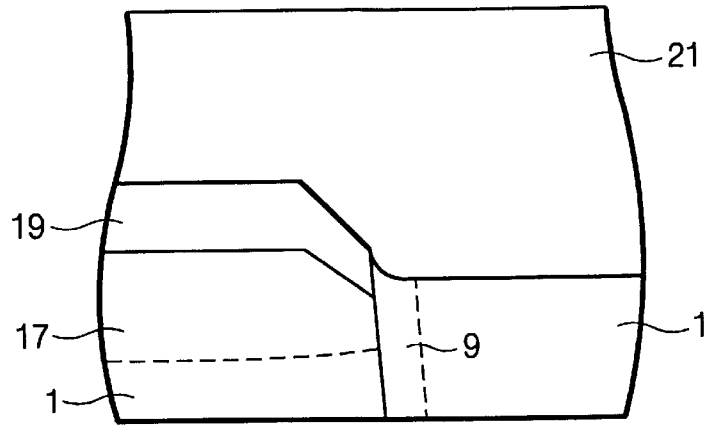
Figure 7A:
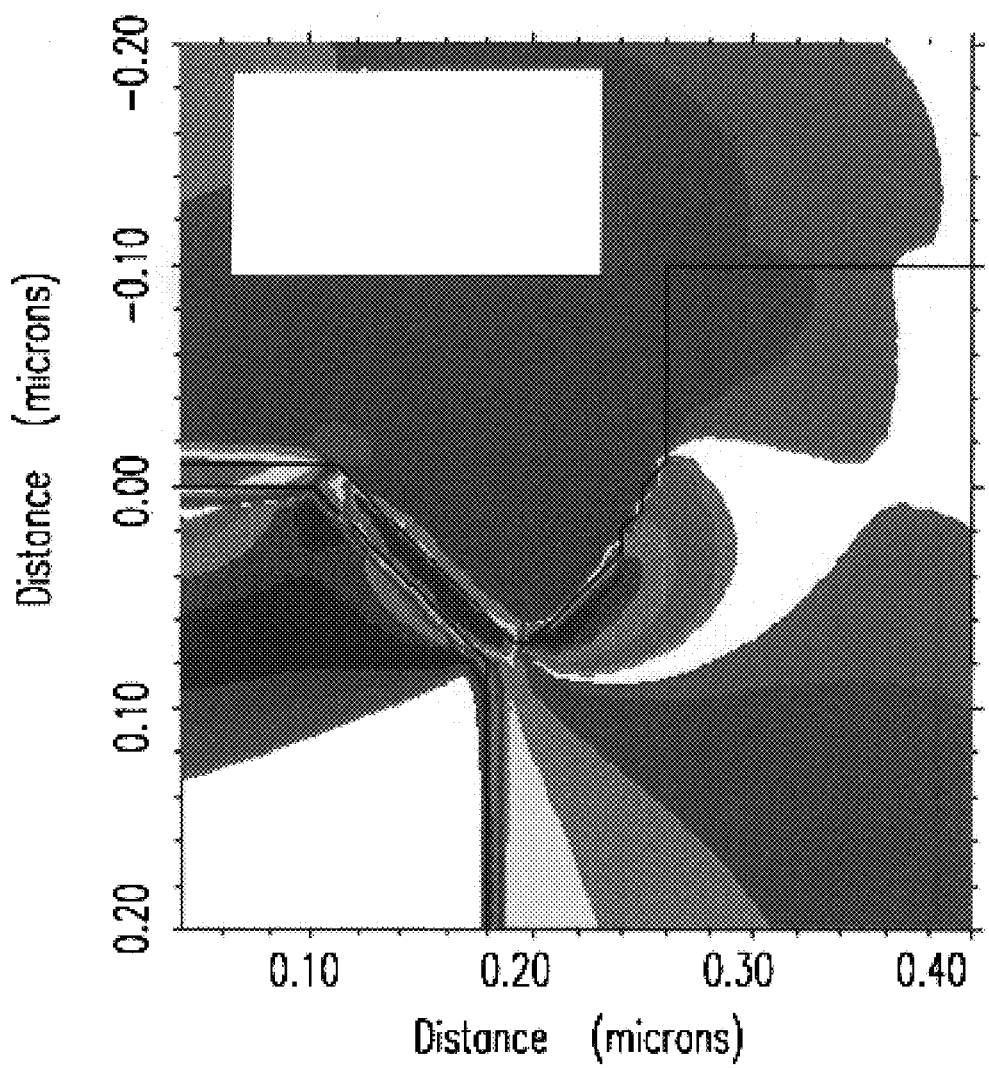
FIGS. 7A through 7C are graphs showing the stress distribution of the semiconductor device at the interface between the sidewall-insulating layer and the gate oxide for various results of the chemical-mechanical polishing step.
Figure 7B:
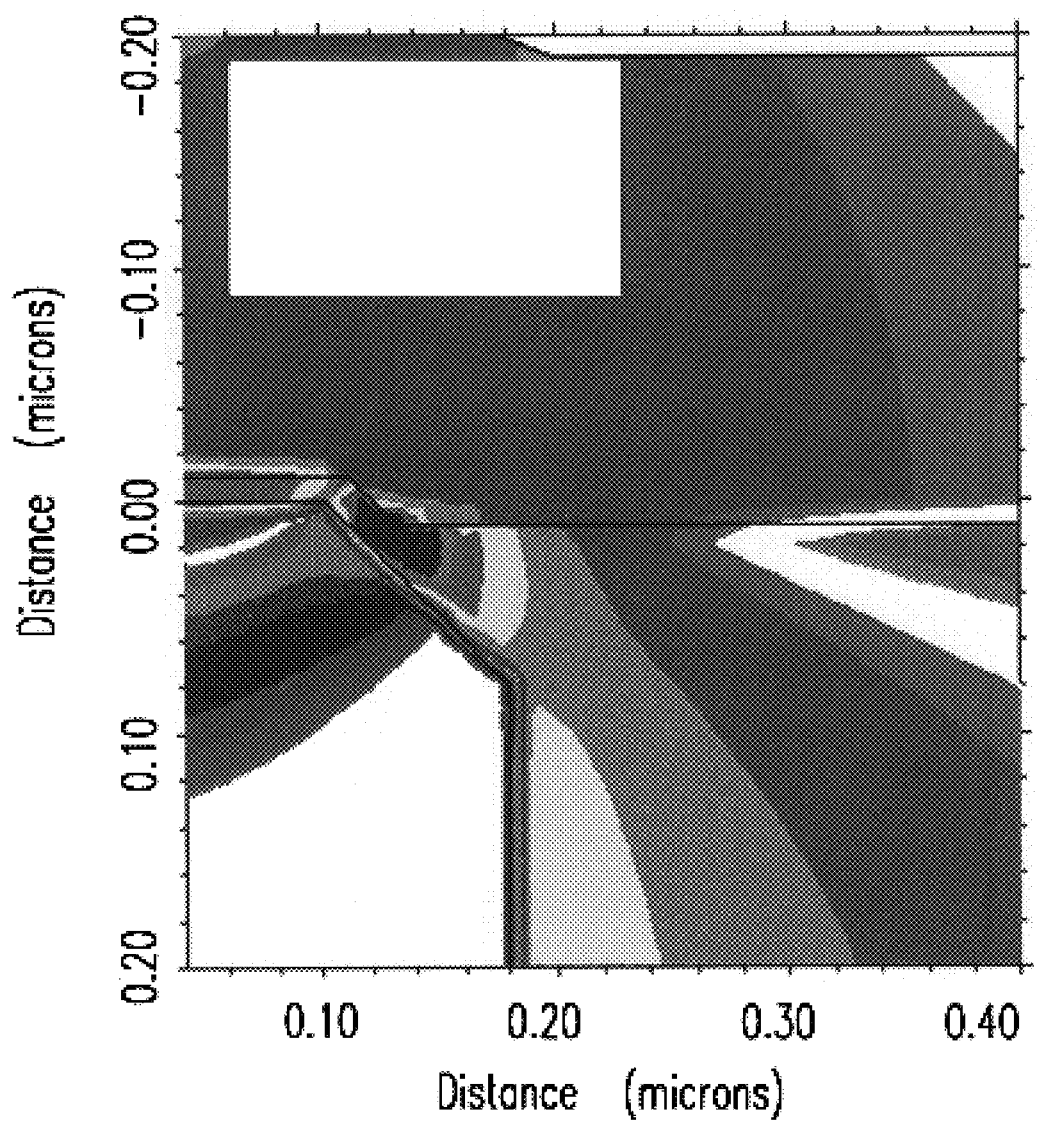
Figure 7C:
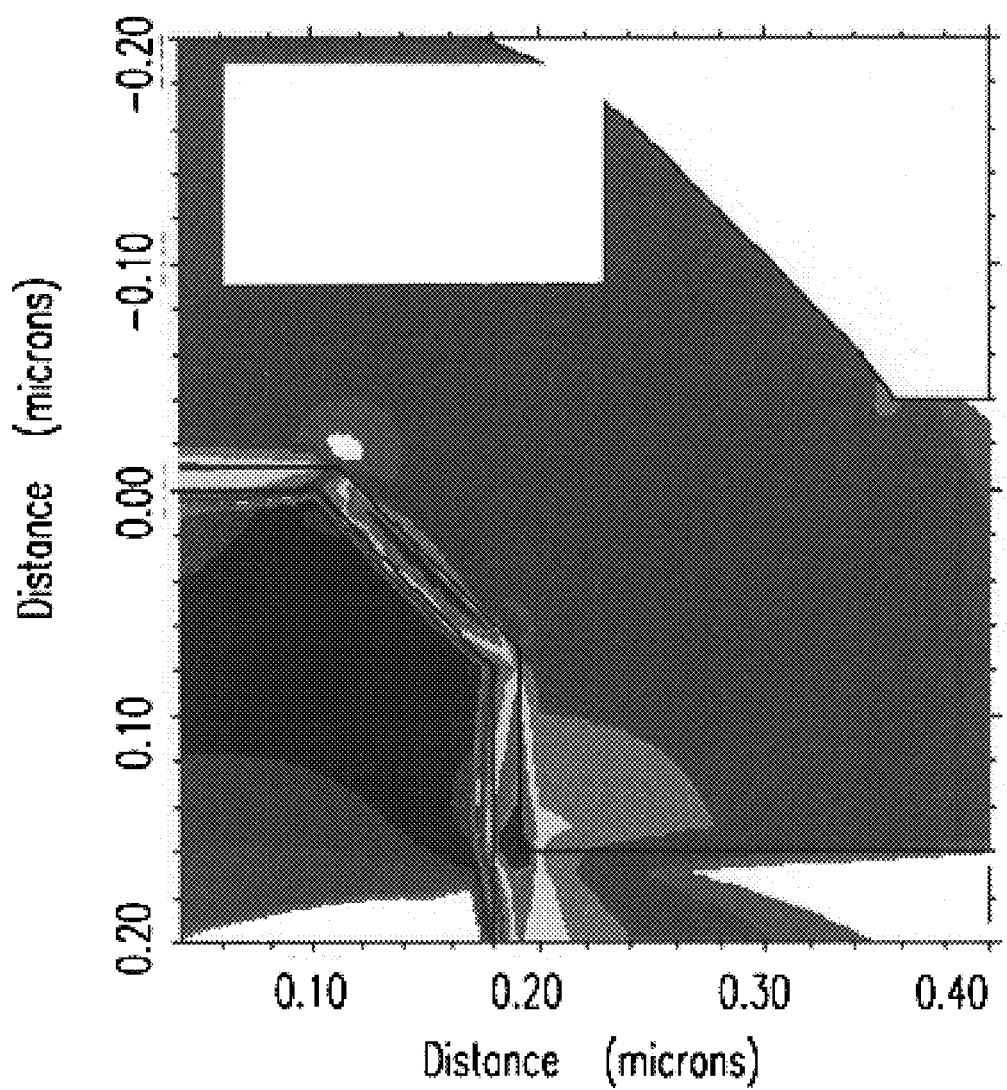

In the present invention, a method is provided that avoids the problems in the conventional method by making sure that the trench-insulating layer 11 has an etching rate higher than the etching rate of the sidewall-insulating layer 9. The preferred method accomplishes this difference in etching rate by modifying the step of forming a sidewall-insulating layer 9 on the bottom and inside walls of the trench 7 and forming a trench-insulating layer 11 in the trench 7 (Step 25). By ensuring a lower etch rate for the sidewall-insulating layer 9, the present invention creates a semiconductor structure that minimizes the stress at the interface of the semiconductor substrate 1, the sidewall-insulating layer 9, the gate oxide layer 19, and the gate electrode 21.

Figure 8A:
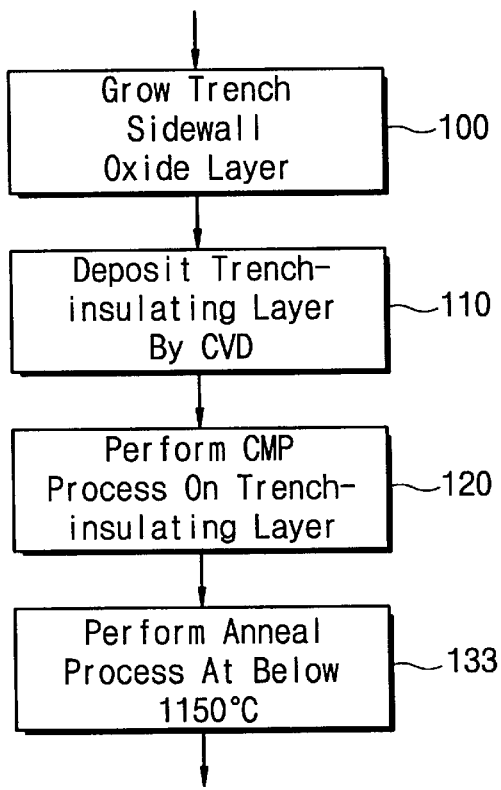
FIGS. 8A, 8B, 8C, and 8D are flow charts illustrating the step of forming the sidewall-insulating layer and the trench-insulating layer according to first through fourth preferred embodiment of the present invention.

FIG. 8A is a flow chart illustrating the step of forming the sidewall-insulating layer 9 and the trench-insulating layer 11 according to a first preferred embodiment of the present invention. In this step, the trench-insulating layer 11 is formed such that it has an etching rate higher than the etching rate of the sidewall-insulating layer 9.

As shown in FIG. 8A, the step of forming a sidewall-insulating layer 9 on the bottom and inside walls of the trench 7 and a trench-insulating layer 11 in the trench 7 is divided into four sub-steps. First, a sidewall-insulating layer 9 is grown on the bottom and inside walls of the trench 7 (Step 100). Preferably the material used is $SiO_2$, although any suitable insulating material may be used.

Then, a trench-insulating layer 11, preferably formed of the same basic material as the sidewall-insulating layer 9, is deposited into the trench 7 and over the silicon nitride layer 5 (Step 110). Preferably the trench-insulating layer 11 is deposited by a CVD process. Also, the trench-insulating layer preferably comprises $SiO_2$. More generally, the trench-insulating layer may comprise a high temperature oxide (HTO), a low temperature oxide (LTO), a plasma enhanced TEOS silicon oxide (PE-TEOS-$SiO_2$), an ozone TEOS silicon oxide ($O_3$-TEOS-$SiO_2$), a plasma-enhanced silane silicon oxide (PE-$SiH_4$-$SiO_2$), a high-density plasma silicon oxide (HDP-$SiO_2$), an electron cyclotron resonance chemical vapor deposition silicon oxide (ECR-CVD-$SiO_2$), or any other suitable insulating material.

The trench-insulating layer 11 is then reduced by a chemical-mechanical polishing (CMP) process using the silicon nitride layer 5 as a stopper (Step 120). As with the conventional method, this leaves the trench 7 filled with the trench-insulating layer 11, and the top of the trench-insulating layer 11 even with the top of the silicon nitride layer 5.

Finally, the semiconductor structure is annealed (densified) at a temperature (800–1150° C.) below 1150° C. (Step 130). Most preferably the annealing step is performed at about 1050° C. This annealing step has the effect of reducing the etch rate of the trench-insulating layer 11. By keeping the annealing step at below 1050° C., the resulting etch rate of the annealed trench-insulating layer 11 will be greater than the etch rate of the sidewall-insulating layer 9.

The difference in etching rates between the sidewall-insulating layer 9 and the trench-insulating layer 11 can be obtained in a number of other ways, however. One alternative is described below, with reference to FIG. 8B, in accordance with a second preferred embodiment of the present invention.

Figure 8B:
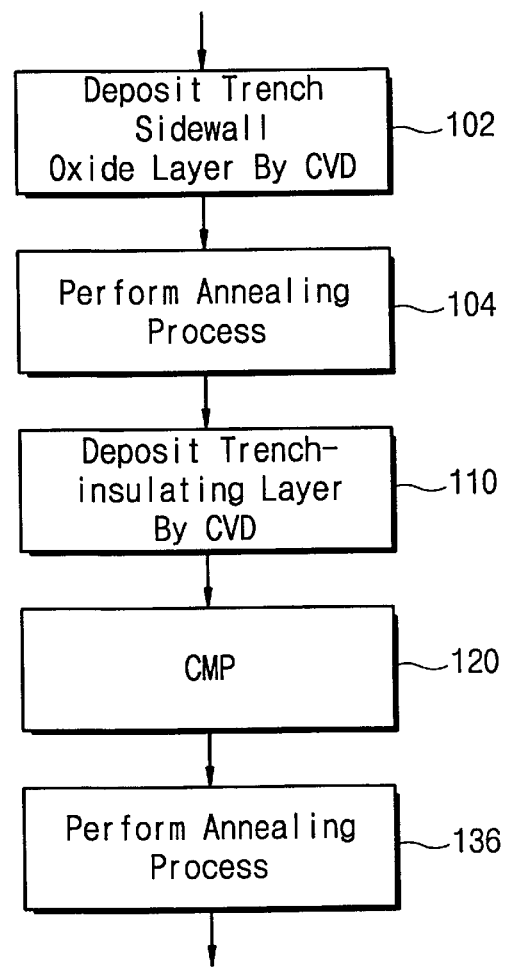

FIG. 8B is a flow chart illustrating the step of forming the sidewall-insulating layer 9 and the trench-insulating layer 11 according to a second preferred embodiment of the present invention. As with the first preferred embodiment, the trench-insulating layer 11 is formed such that it has an etching rate higher than the etching rate of the sidewall-insulating layer 9.

As shown in FIG. 8B, the step of forming a sidewall-insulating layer 9 on the bottom and inside walls of the trench 7 and a trench-insulating layer 11 in the trench 7 is divided into five sub-steps. First, a sidewall-insulating layer 9 is deposited on the bottom and inside walls of the trench 7 (Step 102). Preferably the sidewall-insulating layer 9 is deposited by a CVD process, and preferably the material used is $SiO_2$. However, any suitable deposition method or insulating material may be used.

The semiconductor structure is then annealed (densified) at a suitable temperature (Step 104) in a first annealing process. This first annealing process will have the effect of reducing the etching rate of the sidewall-insulating layer 9.

Then, a trench-insulating layer 11, formed of the same material as the sidewall-insulating layer 9, is deposited into the trench 7 and over the silicon nitride layer 5 (Step 110). Preferably the trench-insulating layer 11 is deposited by a CVD process.

The trench-insulating layer 11 is then reduced by a chemical-mechanical polishing (CMP) process using the silicon nitride layer 5 as a stopper (Step 120). As with the conventional method, this leaves the trench 7 filled with the trench-insulating layer 11, and the top of the trench-insulating layer 11 even with the top of the silicon nitride layer 5.

Finally, the semiconductor structure is again annealed (Step 136) in a second annealing process. This has the effect of reducing the etch rate of both the sidewall-insulating layer 9 and the trench-insulating layer 11. However, since the sidewall-insulating layer 9 was already annealed once in step 104, it will end up with a lower etch rate than the trench-insulating layer 11 after the second annealing process.

Because the second embodiment relies on multiple annealing processes to attain a difference in the etching rate between the sidewall-insulating layer 9 and the trench-insulating layer 11, there is no restriction on the temperature of either annealing process.

In the first and second preferred embodiments, the same material is used for both the sidewall-insulating layer 9 and the trench-insulating layer 11. For example, a thermally-grown $SiO_2$ may be used for the sidewall-insulating layer 9 and CVD $SiO_2$ may be used for the trench-insulating layer 11. In the third and fourth embodiments, however, different materials are used to obtain the desired different etching rates for these layers sidewall-insulating layer 9 and the trench-insulating layer 11.

Figure 8C:
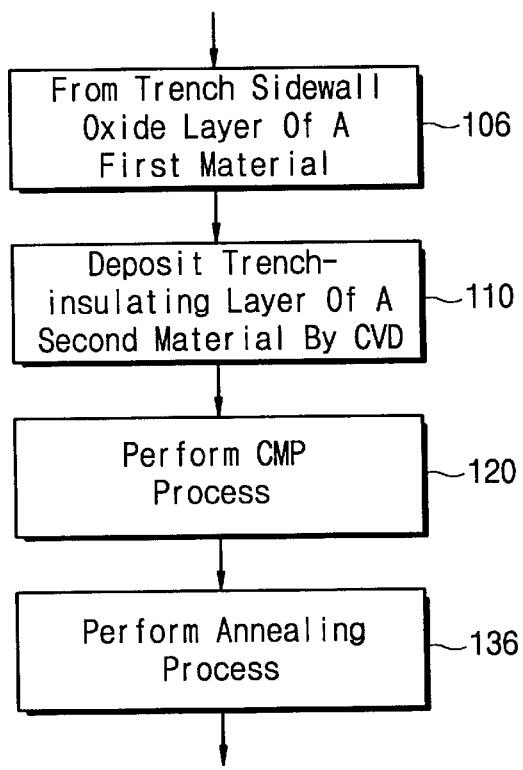

FIG. 8C is a flow chart illustrating the step of forming the sidewall-insulating layer 9 and the trench-insulating layer 11 according to a third preferred embodiment of the present invention. As in the first and second embodiments, the trench-insulating layer 11 is formed such that it has an etching rate higher than the etching rate of the sidewall-insulating layer 9.

As shown in FIG. 8C the step of forming a sidewall-insulating layer 9 on the bottom and inside walls of the trench 7 and a trench-insulating layer 11 in the trench 7 is divided into four sub-steps. First, a sidewall-insulating layer 9 is formed of a first material on bottom and inside walls of the trench 7 (Step 106).

Then, a trench-insulating layer 11, formed of a second material, is deposited into the trench 7 and over the silicon nitride layer 5 (Step 10). Preferably the trench-insulating layer 11 is deposited by a CVD process.

The trench-insulating layer 11 is then reduced by a chemical-mechanical polishing (CMP) process using the silicon nitride layer 5 as a stopper (Step 120). As with the conventional method, this leaves the trench 7 filled with the trenchinsulating layer 11, and the top of the trench-insulating layer 11 even with the top of the silicon nitride layer 5.

Finally, the semiconductor structure is annealed (densified) in an annealing process (Step 136). This annealing step has the effect of reducing the etch rate of the trench-insulating layer 11. However, the etch rate of the trench-insulating layer 11 is not reduced below that of the sidewall-insulating layer 9.

Figure 8D:
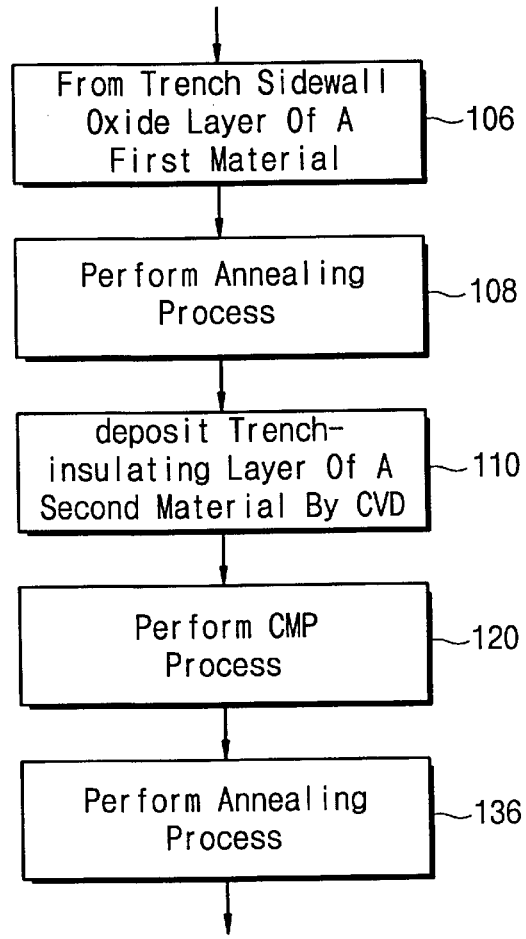

FIG. 8D is a flow chart illustrating the step of forming the sidewall-insulating layer 9 and the trench-insulating layer 11 according to a fourth preferred embodiment of the present invention. As with the first through third preferred embodiments, the trench-insulating layer 11 is formed such that it has an etching rate higher than the etching rate of the sidewall-insulating layer 9.

As shown in FIG. 8D, the step of forming a sidewall-insulating layer 9 on the bottom and inside walls of the trench 7 and a trench-insulating layer 11 in the trench 7 is divided into five sub-steps. First, a sidewall-insulating layer 9 is formed of a first material on the bottom and inside walls of the trench 7 (Step 106). Preferably the sidewall-insulating layer 9 is deposited by a CVD process, although any suitable deposition method may be used.

The semiconductor structure is then annealed (densified) at a suitable temperature (Step 108) in a first annealing process. This first annealing process will have the effect of reducing the etching rate of the sidewall-insulating layer 9.

Then, a trench-insulating layer 11, formed of the same material as the sidewall-insulating layer 9, is deposited into the trench 7 and over the silicon nitride layer 5 (Step 110). Preferably the trench-insulating layer 11 is deposited by a CVD process.

The trench-insulating layer 11 is then reduced by a chemical-mechanical polishing (CMP) process using the silicon nitride layer 5 as a stopper (Step 120). As with the conventional method, this leaves the trench 7 filled with the trenchinsulating layer 11, and the top of the trench-insulating layer 11 even with the top of the silicon nitride layer 5.

Finally, the semiconductor structure is again annealed (Step 136) in a second annealing process. This has the effect of reducing the etch rate of both the sidewall-insulating layer 9 and the trench-insulating layer 11. However, since the sidewall-insulating layer 9 was already annealed once in step 104, it will retain a lower etch rate than the trench-insulating layer 11 after the second annealing process.

Because the fourth embodiment employs multiple annealing processes, it reinforces the difference in the etching rate between the sidewall-insulating layer 9 and the trench-insulating layer 11, and allows a greater freedom in the parameters of both annealing processes.

In the third and fourth embodiments, SiON is preferably is used as the first material and $SiO_2$ is preferably used as the second material. SiON has a lower etch rate than $SiO_2$, and so may be used as the material for the sidewall-insulating layer 9 when SiO, is used for the trench-insulating layer 11. However, any suitable insulating materials may be used as the first and second materials, as long as the first material has a lower etch rate than the second material after the sidewall-insulating layer 9 and the trench-insulating layer 11 are formed and processed.

If SiON is used as the first material, it can be formed in a variety of ways. An $SiO_2$ layer may be grown on the sidewall of the trench 7 and then baked in a nitrogen-rich atmosphere ($N_2$, $NH_3$, or the like). This added baking step results in the formation of a SiON layer as the sidewall-insulating layer 9. Alternatively, an SiN layer may be deposited on the sidewall of the trench 7 and then oxidized in an $O_2$ atmosphere to create an SiON layer as the sidewall-insulating layer 9.

In the third and fourth embodiments, if SiON is used as the first material and $SiO_2$ is used as the second material, the annealing process of the trench-insulating layer 11 in step 136 can be performed at any temperature desired. Regardless of the temperature of the annealing of the $SiO_2$ trench-insulating layer 11, the SiON will have a lower etch rate. In the fourth embodiment, if SiON is used as the first material and $SiO_2$ is used as the second material, the annealing process of the sidewall-insulating layer 9 in step 108 is preferably performed in an $O_2/H_2O$ atmosphere, but can be performed at any temperature desired.

In the present invention, as shown above in the first through fourth embodiments, the ordering of steps 120 and 130 is unimportant. The CMP process (step 120) may be performed before the annealing process (step 130) or after the annealing process. In either situation, the trench-insulating layer will be annealed and polished. Therefore, although FIGS. 8A through 8D each disclose the CMP process occurring before the annealing process, the order of the two could be reversed and still remain within the scope of the invention.

Figure 9A:
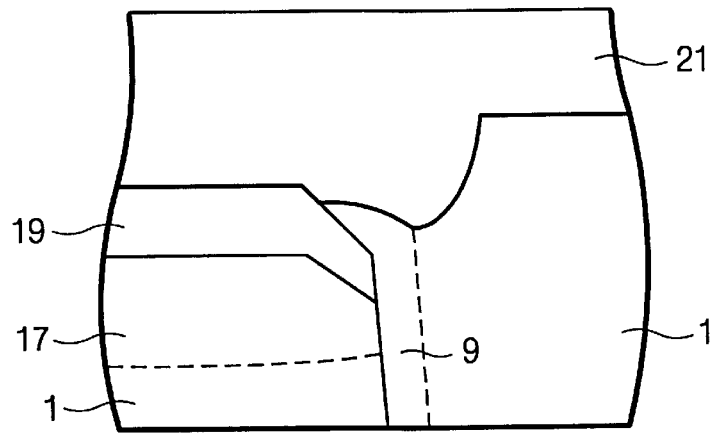
FIGS. 9A, 9B, and 9C are cross-sectional views showing the interface between the sidewall-insulating layer and the gate oxide for various results of the chemical-mechanical polishing step after processing according to preferred embodiments of the present invention.
Figure 9B:
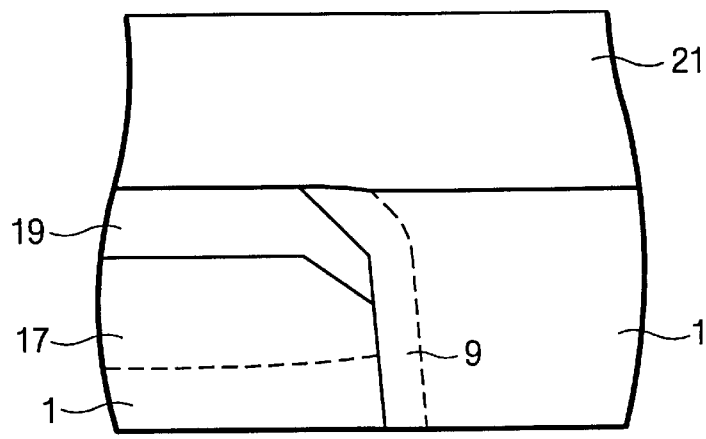
Figure 9C:
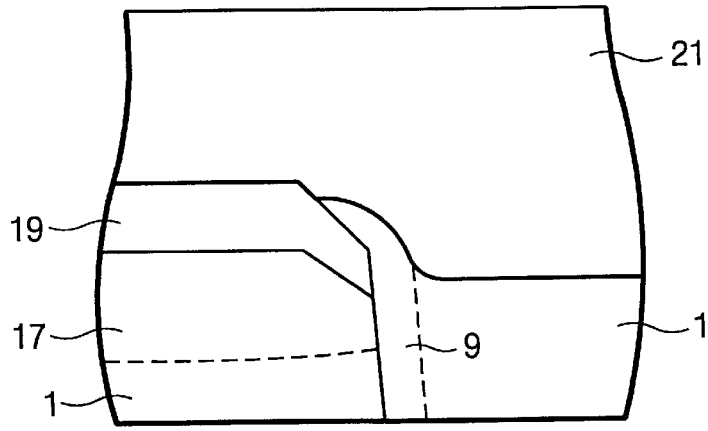
Figure 10A:
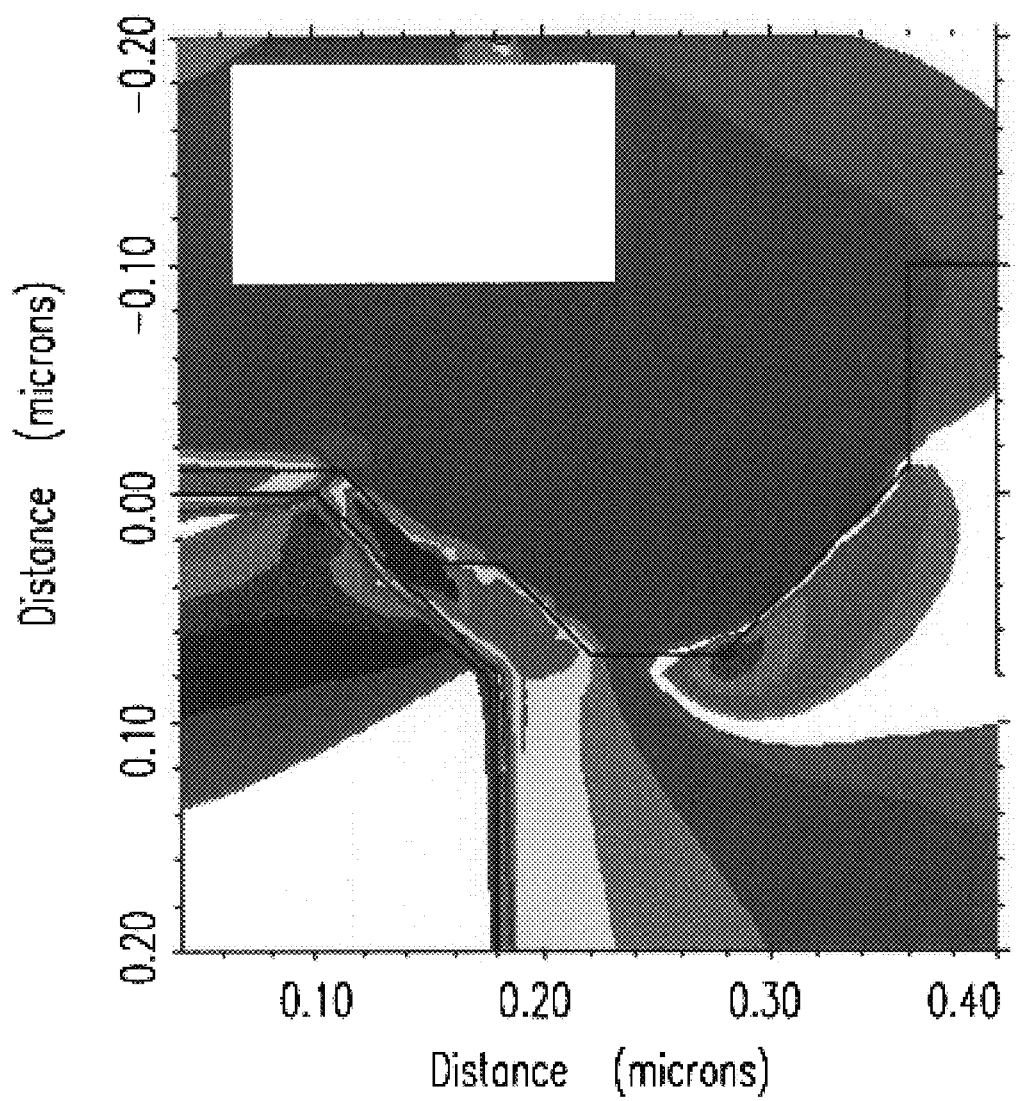
FIGS. 10A, 10B, and 10C are graphs showing the stress distribution of semiconductor devices at the interface between the sidewall-insulating layer and the gate oxide for various results of the chemical-mechanical polishing step after processing according to preferred embodiments of the present invention.
Figure 10B:
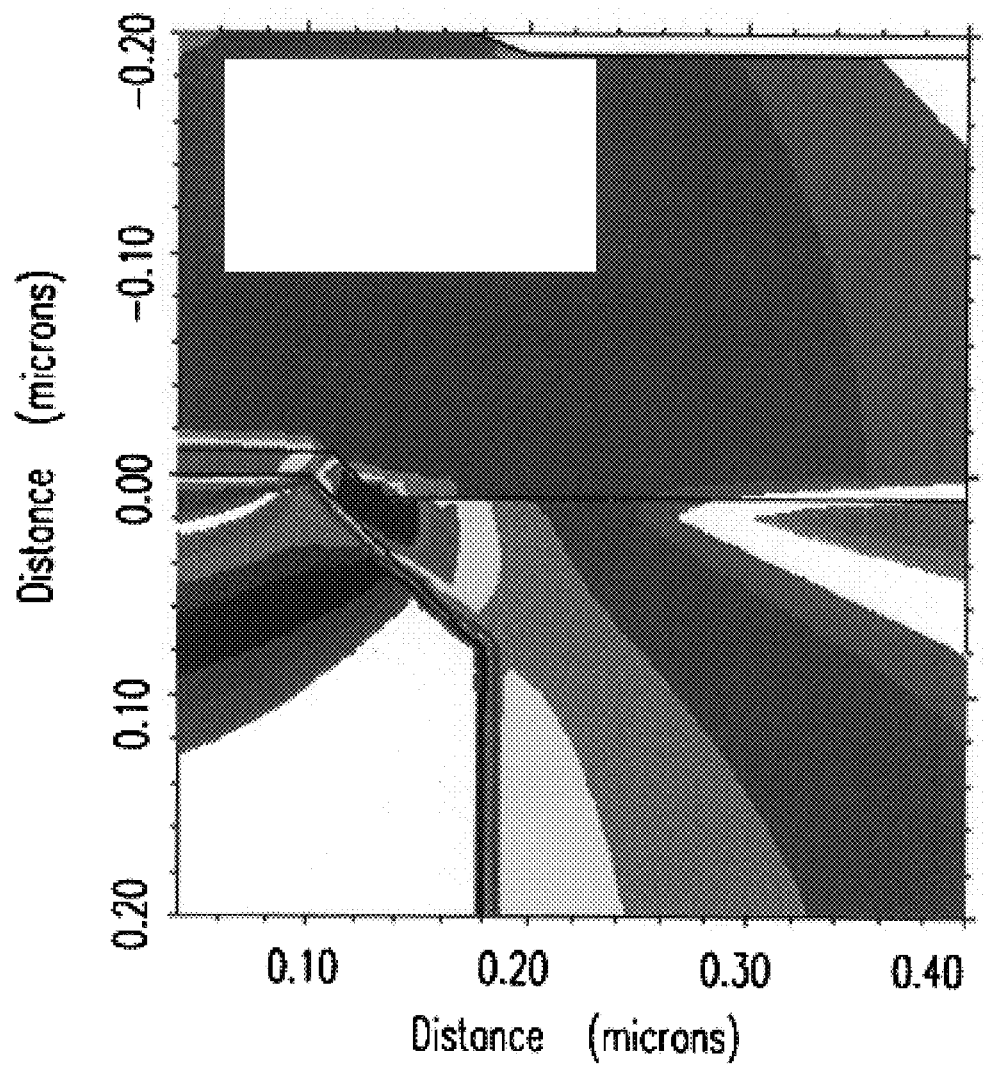
Figure 10C:
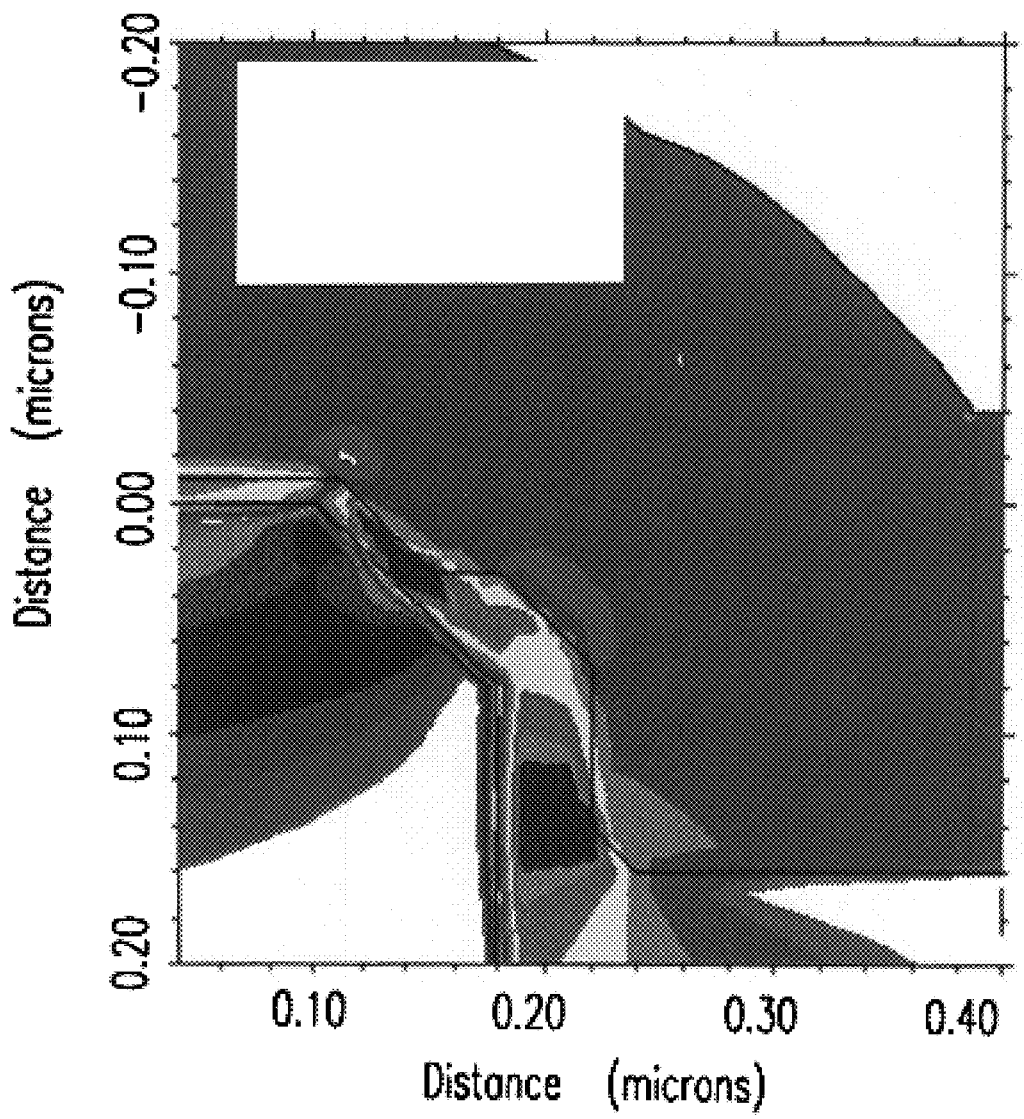
Figure 11A:
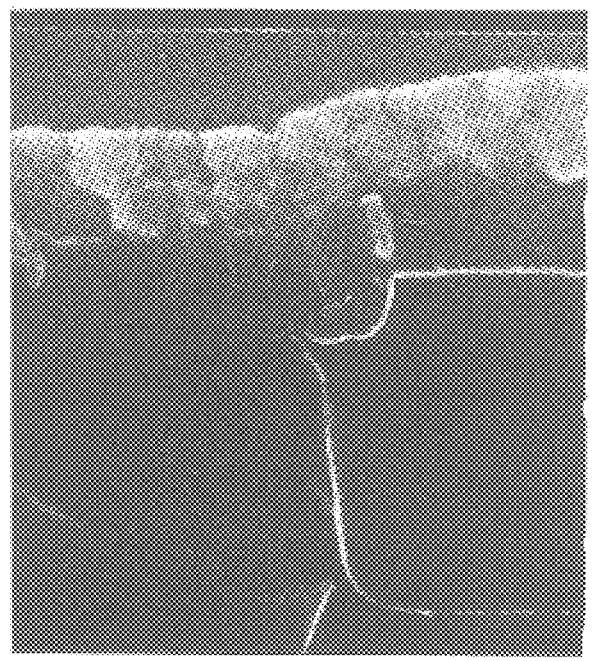
FIGS. 11A, 11B, and 11C are cross-sectional pictures of trench-isolation semiconductor devices at the sidewall-insulating layer and the gate oxide for various results of the chemical-mechanical polishing step after processing according to preferred embodiments of the present invention.
Figure 11B:
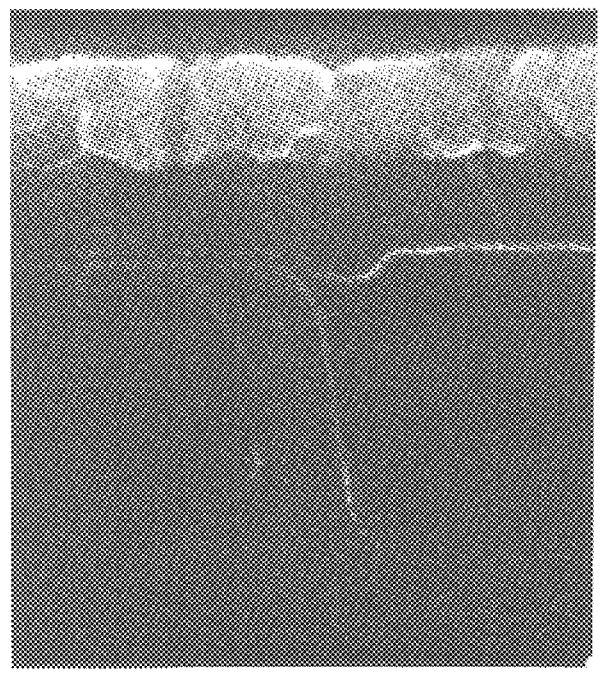
Figure 11C:
Figure 12:
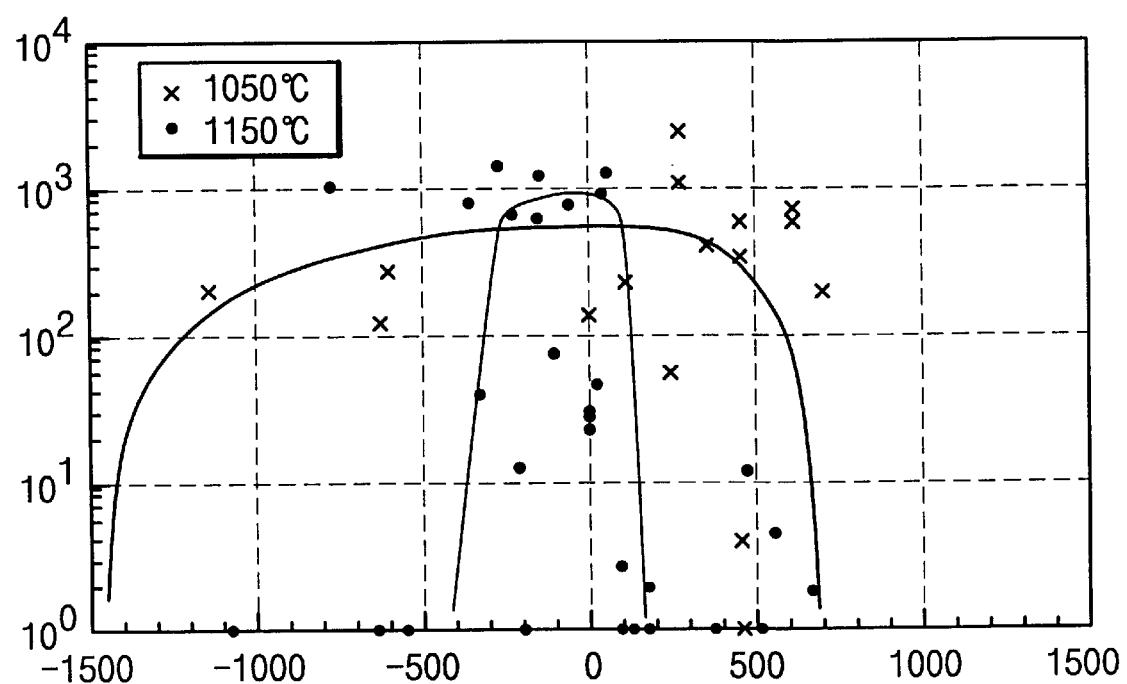
FIG. 12 is a graph showing the time dependent dielectric breakdown (TDDB) of a trench-isolation semiconductor device manufactured according to a first preferred embodiment of the present invention compared to a semiconductor device manufactured by the conventional method.

FIGS. 9A to 9C, 10A to 10C, 11A to 11C, and 12 illustrate the results of this invention, as described above in the first through fourth embodiments. FIGS. 9A, 9B, and 9C are cross-sectional views showing the interface between the sidewall-insulating layer 9 and the gate oxide 19 for various results of the chemical-mechanical polishing step after processing according to preferred embodiments of the present invention. FIGS. 10A, 10B, and 10C are graphs showing the stress distribution of semiconductor devices at the interface between the sidewall-insulating layer 9 and the gate oxide 19 for various results of the chemical-mechanical polishing step after processing according to preferred embodiments of the present invention. FIGS. 11A, 11B, and 11C are cross-sectional pictures of trench-isolation semiconductor devices at the interface between the sidewall-insulating layer 9 and the gate oxide 19 for various results of the chemical-mechanical polishing step after processing according to preferred embodiments of the present invention. FIG. 12 is a graph showing the time dependent dielectric breakdown (TDDB) of a trench-isolation semiconductor device for annealing temperatures of 1050° C. and 1150° C.; and As shown in FIGS. 9B, 10B, and 11B, in the present invention, when the trench-insulating layer 11 is formed to be of the desired height, the interface between the sidewall-insulating layer 9 and the gate oxide layer 19 is smooth and the stress generated is relatively low. As in the conventional method, this lower stress results in a higher TDDB factor and allows the resulting device to operate within acceptable parameters. The difference in etch rates between the sidewall-insulating layer 9 and the trench-insulating layer 11 does not significantly change the operational parameters of the semiconductor device when the trench-insulating layer 11 is formed to be of the desired height.

If, however, the trench-insulating layer 11 is formed too high, as shown in FIGS. 9A, 10A, and 11A, the lower etch rate of the sidewall-insulating layer 9 will result in a more stable interface between the sidewall-insulating layer 9 and the gate oxide layer 19. As seen in FIG. 9A, rounded and three-stepped portions at the top corners of the sidewall-insulating layer 9 are formed because the trench-insulating layer 11 is etched in a lateral direction faster than the sidewall-insulating layer 9.

Similarly, if the trench-insulating layer 11 is formed too low, as shown in FIGS. 9C, 10C, and 11C, the lower etch rate of the sidewall-insulating layer 9 will result in a more stable interface between the sidewall-insulating layer 9 and the gate oxide layer 19. As seen in FIG. 9C, rounded and three-stepped portions at the top corners of the sidewall-insulating layer 9 are formed because the trench-insulating layer 11 is etched in a lateral direction faster than the sidewall-insulating layer 9.

In each of the cases shown above, the lower etch rate of the sidewall-insulating layer 9 cause it to be etched less and thus form a slightly raised portion as compared to the layers to either side (FIGS. 9A, 9C, 11A, and 11C). This slightly raised portion in turn lowers the stress of the overall structure (FIGS. 10A and 10C) makes it more stable over a larger range of heights.

The improved stress profile has the corresponding effect of increasing the TDDB factor over a corresponding range of heights. Since TDDB is a measure of the reliability of the device, the reliability is increased over a greater range of height. Ultimately, this increases the yield of the production process and increases reliability by causing more of the manufactured devices to fall within acceptable parameters.

FIG. 12 is a graph showing the time dependent dielectric breakdown (TDDB) measurement compared to the height of the trench-isolation region for a device manufactured according to the conventional method (at a temperature of 1150° C.) compared to a device manufactured according to the first preferred embodiment (at a temperature of 1050° C.). The "0" on the height axis of the graph represents the desired level of the trench-isolation layer 11; the negative values represent heights below the desired height; and the positive values represent heights above the desired height. In these measurements, a voltage of 12 volts was applied to the gate.

If we assume that a TDDB value of 100 seconds is a minimum threshold for acceptable performance, we can see that the device manufactured according to the first preferred embodiment has a much wider range of functionality. The device manufactured by the conventional method has a TDDB value above 100 seconds only for trench-insulating regions between about 300Å too low to about 150 Å too high. Anything manufactured outside this range will not have acceptable operation parameters.

In contrast, the device manufactured according to the first preferred embodiment has a TDDB value above 100 seconds for trench-insulating regions between about 1200 Å too low to about 600Å too high, a fourfold improvement over the conventional method. This allows a much greater usable range of heights and can substantially increase the yield and reliability of trench-isolation semiconductor devices.

The present invention has been described by way of a specific exemplary embodiments, and the many features and advantages of the present invention are apparent from the written description. Thus, it is intended that the appended claims cover all such features and advantages of the invention. Further, since numerous modifications and changes will readily occur to those skilled in the art, it is not desired to limit the invention to the exact construction and operation ad illustrated and described. Hence, all suitable modifications and equivalents may be resorted to as falling within the scope of the invention.

What is claimed is:

1. A method for forming a trench isolation structure in an integrated circuit, the method comprising the steps of:

etching a trench in a semiconductor substrate;

depositing a sidewall-insulating layer comprising an insulating material along the sidewall and bottom of the trench;

performing a first annealing process to lower the etch rate of the sidewall-insulating layer from an original sidewall etch rate to a first annealed sidewall etch rate;

depositing a trench-insulating layer comprising the insulating material in the trench and over the annealed sidewall insulator;

performing a chemical-mechanical polishing process to reduce the height of the trench-insulating layer;

performing a second annealing process to lower the etch rate of the sidewall-insulating layer from the first annealed sidewall etch rate to a second annealed sidewall etch rate, and to lower the etch rate of the trench-insulating layer from an original trench etch rate to an annealed trench etch rate;

performing ion implantation in the semiconductor substrate adjacent to the trench to form at least one doped region;

growing a gate oxide layer over the at least one doped region; and depositing a gate electrode over the trench and the gate oxide, wherein the second annealed sidewall etch rate is lower than the annealed trench etch rate.

2. A method for forming a trench isolation structure in an integrated circuit, as recited in claim 1, the method further comprising the steps of:

depositing and patterning an active silicon nitride layer over the substrate prior to the step of etching the trench; and removing the active silicon nitride layer after the step of performing a chemical-mechanical polishing process.

3. A method for forming a trench isolation structure in an integrated circuit, as recited in claim 1, the method further comprising the steps of:

growing a pad oxide layer over the semiconductor substrate prior to the step of etching the trench; and removing the pad oxide layer prior to the step of performing ion implantation.

4. A method for forming a trench isolation structure in an integrated circuit, as recited in claim 1, wherein the sidewall-insulating layer comprises $SiO_2$.

5. A method for forming a trench isolation structure in an integrated circuit, as recited in claim 1, wherein the trench-insulating layer comprises a material chosen from the group of: high temperature oxides (HTO), low temperature oxides (LTO), plasma enhanced TEOS silicon oxide (PE-TEOS-$SiO_2$), ozone TEOS silicon oxide ($O_3$-TEOS-$SiO_2$), plasma-enhanced silane silicon oxide (PE-$SiH_4$-$SiO_2$), high-density plasma silicon oxide (HDP-$SiO_2$), or electron cyclotron resonance chemical vapor deposition silicon oxide (ECR-CVD-$SiO_2$).

6. A method for forming a trench isolation structure in an integrated circuit, the method comprising the steps of:

etching a trench in a semiconductor substrate;

forming a sidewall-insulating layer comprising a first insulating material along the sidewall and bottom of the trench;

performing a first annealing step to lower the etch rate of the sidewall-insulating layer from an original sidewall etch rate to an annealed sidewall etch rate;

depositing a trench-insulating layer comprising a second insulating material in the trench and over the sidewall-insulating layer;

performing a chemical-mechanical polishing process to reduce the height of the trench-insulating layer;

performing a final annealing process to lower the etch rate of the trench-insulating layer from an original trench etch rate to an annealed trench etch rate, and to lower the etch rate of the sidewall-insulating layer from the annealed sidewall etch rate to the final sidewall etch rate;

performing ion implantation in the semiconductor substrate adjacent to the trench to form at least one doped region;

growing a gate oxide layer over the at least one doped region; and depositing a gate electrode over the trench and the gate oxide layer, wherein a final sidewall etch rate of the first insulating material is lower than the annealed trench etch rate of the second insulating material and wherein the step of forming a side-wall insulating layer is performed by depositing the first insulating material along the sidewall and bottom of the trench.

7. A method for forming a trench isolation structure in an integrated circuit, as recited in claim 6, the method further comprising the steps of:

depositing and patterning an active silicon nitride layer over the semiconductor substrate prior to the step of etching the trench; and removing the active silicon nitride layer after the step of performing a chemical-mechanical polishing process.

8. A method for forming a trench isolation structure in an integrated circuit, as recited in claim 6, the method further comprising the steps of:

growing a pad oxide layer over the semiconductor substrate prior to the step of etching the trench; and removing the pad oxide layer prior to the step of performing ion implantation.

9. A method for forming a trench isolation structure in an integrated circuit, as recited in claim 6, wherein the trench-insulating layer comprises a material chosen from the group of: high temperature oxides (HTO), low temperature oxides (LTO), plasma enhanced TEOS silicon oxide (PE-TEOS-$SiO_2$), ozone TEOS silicon oxide ($O_3$-TEOS-$SiO_2$), plasma-enhanced silane silicon oxide (PE-$SiH_4$-$SiO_2$), high-density plasma silicon oxide (HDP-$SiO_2$), or electron cyclotron resonance chemical vapor deposition silicon oxide (ECR-CVD-$SiO_2$).

10. A method for forming a trench isolation structure in an integrated circuit, as recited in claim 6, wherein the sidewall-insulating layer comprises silicon oxynitride (SiON).

11. A method for forming a trench isolation structure in an integrated circuit, as recited in claim 10, wherein the step of forming a sidewall-insulating layer is performed by depositing silicon oxynitride (SiON) along the sidewall and bottom of the trench.

12. A method for forming a trench isolation structure in an integrated circuit, the method comprising the steps of:

etching a trench in a semiconductor substrate;

forming a sidewall-insulating layer comprising a first insulating material along the sidewall and bottom of the trench;

depositing a trench-insulating layer comprising a second insulating material in the trench and over the sidewall-insulating layer;

performing a chemical-mechanical polishing process to reduce the height of the trench-insulating layer;

performing a final annealing process to lower the etch rate of the trench-insulating layer from an original trench etch rate to an annealed trench etch rate;

performing ion implantation in the semiconductor substrate adjacent to the trench to form at least one doped region;

growing a gate oxide layer over the at least one doped region; and depositing a gate electrode over the trench and the gate oxide layer, wherein a final sidewall etch rate of the first insulating material is lower than the annealed trench etch rate of the second insulating material, wherein the sidewall-insulating layer comprises silicon oxynitride (SiON), and wherein the step of forming a sidewall-insulating layer further comprises the sub-steps of:

depositing a silicon nitride (SiN) layer along the sidewall and bottom of the trench; and oxidizing the silicon nitride (SiN) layer in an $O_2$ ambient atmosphere to form the sidewall-insulating layer.

13. A method for forming a trench isolation structure in an integrated circuit, as recited in claim 10, wherein the step of forming a sidewall-insulating layer further comprises the sub-steps of:

growing an $SiO_2$ layer along the sidewall and bottom of the trench; and baking the $SiO_2$ layer in a nitrogen-rich ambient atmosphere to form the sidewall-insulating layer.

14. A method for forming a trench isolation structure in an integrated circuit, as recited in claim 13, wherein the nitrogen-rich ambient atmosphere is one of $N_2$ or $NH_3$.

* * * * *